US012802081B2

(12) United States Patent
Yajima

(10) Patent No.: US 12,802,081 B2
(45) Date of Patent: Nov. 17, 2026

(54) SERVER SYSTEM, REFRIGERANT LEAKAGE REPAIRING SYSTEM

(71) Applicant: DAIKIN INDUSTRIES, LTD., Osaka (JP)

(72) Inventor: Ryuzaburo Yajima, Osaka (JP)

(73) Assignee: DAIKIN INDUSTRIES, LTD., Osaka (JP)

(*) Notice: Subject to any disclaimer, the term of this patent is extended or adjusted under 35 U.S.C. 154(b) by 0 days.

(21) Appl. No.: 19/062,588

(22) Filed: Feb. 25, 2025

(65) Prior Publication Data

US 2025/0190996 A1 Jun. 12, 2025

Related U.S. Application Data

(63) Continuation of application No. PCT/JP2023/031134, filed on Aug. 29, 2023.

(30) Foreign Application Priority Data

Sep. 21, 2022 (JP) ................................ 2022-150270

(51) Int. Cl.
*G06Q 30/012* (2023.01)
*G01M 3/00* (2006.01)
(Continued)

(52) U.S. Cl.
CPC .......... *G06Q 30/012* (2013.01); *G01M 3/002* (2013.01); *G06Q 10/20* (2013.01); *H05K 7/20827* (2013.01)

(58) Field of Classification Search
CPC ..... G06Q 30/012; G06Q 10/20; G01M 3/002; H05K 7/20827
See application file for complete search history.

(56) References Cited

U.S. PATENT DOCUMENTS 6,853,958 B1 * 2/2005 Turin ...................... H04L 12/66 702/182
9,741,023 B2 8/2017 Arensmeier et al.
(Continued)

FOREIGN PATENT DOCUMENTS

JP 2018-032184 3/2018
JP 2018-132235 8/2018
(Continued)

OTHER PUBLICATIONS

Hjortland, Andrew L. Automated fault detection, diagnostics, impact evaluation, and service decision-making for direct expansion air conditioners. Diss. Purdue University, 2018. (Year: 2018).*
(Continued)

*Primary Examiner* — Asfand M Sheikh
(74) *Attorney, Agent, or Firm* — IPUSA, PLLC

(57) ABSTRACT

A server system includes a memory configured to store warranty subscription information indicating whether or not each of air conditioners is subscribed to a repair warranty against a refrigerant leakage, a device configured to acquire a leakage notification indicating a detection of the refrigerant leakage of an arbitrary air conditioner, and a transmission device configured to transmit notification information including the warranty subscription information corresponding to the arbitrary air conditioner to an information terminal used by a user of the arbitrary air conditioner.

15 Claims, 16 Drawing Sheets

(51) Int. Cl.
*G06Q 10/20* (2023.01)
*H05K 7/20* (2006.01)

(56) References Cited

U.S. PATENT DOCUMENTS

| | | | | |
|---|---|---|---|---|
| 10,783,588 | B1* | 9/2020 | Allen | G06Q 30/0215 |
| 2002/0000092 | A1* | 1/2002 | Sharood | H04L 12/282<br>62/127 |
| 2002/0165784 | A1* | 11/2002 | Taggart | G06Q 30/02<br>705/26.8 |
| 2004/0019578 | A1* | 1/2004 | Kalmes | G06F 16/90344 |
| 2011/0078084 | A1* | 3/2011 | Gupta | G06Q 30/06<br>705/302 |
| 2013/0231991 | A1* | 9/2013 | Denari | G06Q 30/0222<br>705/14.23 |
| 2014/0136423 | A1* | 5/2014 | Moreton | G06Q 30/012<br>705/302 |
| 2014/0216071 | A1* | 8/2014 | Broadbent | H04L 67/125<br>62/89 |
| 2015/0358218 | A1* | 12/2015 | Nasir | H04L 41/0803<br>709/224 |
| 2016/0117646 | A1* | 4/2016 | Lerick | G06Q 10/1093<br>705/7.21 |
| 2017/0004508 | A1* | 1/2017 | Mansfield | G06Q 30/012 |
| 2018/0240124 | A1* | 8/2018 | Natarajan | G06Q 30/014 |
| 2019/0196430 | A1 | 6/2019 | Seo et al. | |
| 2020/0302549 | A1* | 9/2020 | Jordan, II | G06Q 50/163 |
| 2022/0005051 | A1* | 1/2022 | Miller | G06F 16/245 |
| 2022/0404053 | A1 | 12/2022 | Kuroda et al. | |
| 2023/0316295 | A1* | 10/2023 | Fukuda | G06Q 30/012<br>705/302 |
| 2026/0017666 | A1* | 1/2026 | Takasaki | G06Q 30/012 |

FOREIGN PATENT DOCUMENTS

| | | |
|---|---|---|
| JP | 2018-206005 | 12/2018 |
| JP | 2019-211108 | 12/2019 |
| JP | 2021-139615 | 9/2021 |
| WO | 2018/042675 | 3/2018 |

OTHER PUBLICATIONS

Hong, Sung Bin, Jin Woo Yoo, and Min Soo Kim. "A theoretical refrigerant charge prediction equation for air source heat pump system based on sensor information." International Journal of Refrigeration 104 (2019): 335-343. (Year: 2019).*

Extended European search report mailed on Sep. 1, 2025 with respect to the corresponding European patent application No. 23867976.5.

International Search Report for PCT/JP2023/031134 mailed on Oct. 10, 2023.

International Preliminary Report on Patentability for PCT/JP2023/031134 mailed on Apr. 3, 2025.

* cited by examiner

FIG.6

| User ID | User name | Content information | Address |
|---|---|---|---|
| 111A | Hanako Ookane | ・・・ | ・・・ |
| 111B | Taro Kuuchou | ・・・ | ・・・ |
| 111C | ・・・ | ・・・ | ・・・ |
| ・・・ | ・・・ | ・・・ | ・・・ |

FIG.7

USER ID: 111A

| Device identification information | | | | | Repair service provider information | |
|---|---|---|---|---|---|---|
| Device ID | Device name | Product serial number | Product sale date | Manufacturer's warranty period | Name of provider | Contact information |
| 000a1 | Unit a1 | A0000XXXXX | 2016/6/15 | 3 years | Provider X1 | ... |
| 000b2 | Unit b1 | B0000YYYYY | 2014/11/6 | 5 years | Provider X2 | ... |
| 000c1 | Unit c1 | C0000ZZZZZ | 2021/8/5 | 1 year | Provider X3 | ... |
| ... | ... | ... | ... | ... | ... | ... |

FIG.8

(a)

Device ID: 000a1

| Warranty subscription information | | | | Repair history information | | |
|---|---|---|---|---|---|---|
| Presence or absence of leakage repair warranty subscription | Warranty validity period | Warranty subscription date | Warranty expiration date | Repair response date | Warranty fee | Response content |
| Coverage present | 10 years | 2016/6/15 | 2026/6/15 | 2022/6/23 | 25000 yens | Valve replacement |

(b)

Device ID: 000b1

| Warranty subscription information | | | | Repair history information | | |
|---|---|---|---|---|---|---|
| Presence or absence of leakage repair warranty subscription | Warranty validity period | Warranty subscription date | Warranty expiration date | Repair response date | Warranty fee | Response content |
| Coverage present | 8 years | 2014/11/6 | 2022/11/6 | – | – | – |

(c)

Device ID: 000c1

| Warranty subscription information | | | | Repair history information | | |
|---|---|---|---|---|---|---|
| Presence or absence of leakage repair warranty subscription | Warranty validity period | Warranty subscription date | Warranty expiration date | Repair response date | Warranty fee | Response content |
| Absent | – | – | – | – | – | – |

SERVER SYSTEM, REFRIGERANT LEAKAGE REPAIRING SYSTEM

CROSS-REFERENCE TO RELATED APPLICATIONS

This application is a continuation application of International Application No. PCT/JP2023/031134 filed on Aug. 29, 2023 and designated the U.S., which is based upon and claims priority to Japanese Patent Application No. 2022-150270, filed on Sep. 21, 2022, the entire contents of which are incorporated herein by reference.

TECHNICAL FIELD

The present disclosure relates to server systems, and refrigerant leakage repairing systems.

BACKGROUND ART

Conventionally, an air conditioner employing a proposed technology detects a change in an operating state caused by a refrigerant leakage, and sends a leakage notification (leakage call) indicating that the refrigerant leakage occurred to a management server, so that the management server notifies a user of the air conditioner that the refrigerant leakage occurred (refer to Patent Document 1). Thus, the user determines whether or not to make a repair request to a repair service provider, by taking into consideration a repair cost, a time required for the repair, or the like. In a case where the user determines that the repair request is to be made, the user makes the repair request to the repair service provider by telephone or the like, and the repair is performed thereafter.

PRIOR ART DOCUMENTS

Patent Documents

Patent Document 1: Japanese Laid-Open Patent Publication No. 2019-211108

However, when the user determines whether or not to make the repair request to the repair service provider, it takes time to check a current coverage of the air conditioner, such as a warranty period, a repair service contact, or the like, and for this reason, the user does not always make the repair request immediately. Particularly in the case of the refrigerant leakage, unlike the case where the air conditioner becomes inoperable due to corrosion of a circuit or the like, the air conditioner is operable and an operating efficiency merely deteriorates. For this reason, the refrigerant leakage tends to be neglected by the user. In addition, in a case where the air conditioner is within a free warranty period of a manufacturer (manufacturer's warranty period), the repair can be made for free, but in a case where the air conditioner is out of the free warranty period, the user must also consider whether or not to accept the repair cost, and the refrigerant leakage even more likely to be neglected by the user.

Moreover, in a case where the user postpones the repair request, and makes the repair request when the user senses a deterioration in heating and cooling provided by the air conditioner, a situation in which most of the refrigerant leaked may occur. Further, even if the user makes the repair request at a timing to perform a full-scale heating and cooling, the repair cannot be performed immediately in many cases due to crowded repair requests, and thus, a situation in which the refrigerant leakage further progresses may occur.

SUMMARY

In view of the above circumstances, it is an object of the present disclosure to encourage a user of an air conditioner that is operable even when a refrigerant leakage occurs to voluntarily make a repair request with respect to the refrigerant leakage.

A server system according to an aspect of the present disclosure includes a hardware memory configured to store warranty subscription information indicating whether or not each of a plurality of air conditioners is subscribed to a repair warranty against a refrigerant leakage; and a processor configured to execute a program stored in the hardware memory and perform a process including acquiring a leakage notification indicating a detection of the refrigerant leakage of an arbitrary air conditioner among the plurality of air conditioners; and transmitting notification information including the warranty subscription information corresponding to the arbitrary air conditioner to an information terminal used by a user of the arbitrary air conditioner.

BRIEF DESCRIPTION OF THE DRAWINGS

FIG. 6 is a conceptual diagram illustrating a user information management table.

FIG. 7 is a conceptual diagram illustrating a device information management table.

FIG. 8 is a conceptual diagram illustrating each of warranty information management tables.

DESCRIPTION OF EMBODIMENTS

Hereinafter, embodiments of the present disclosure will be described with reference to FIG. 1 through FIG. 17.

Figure 1:
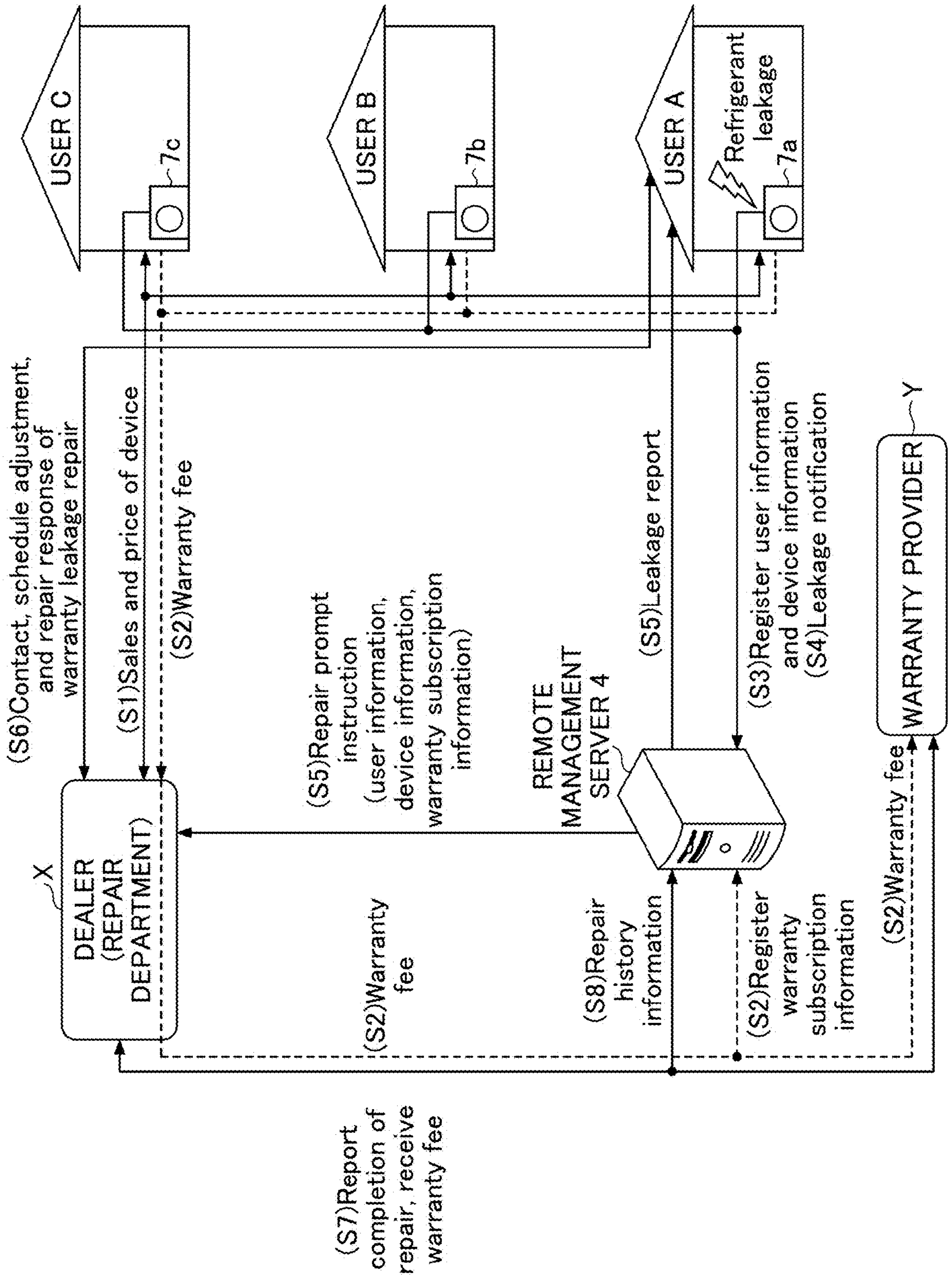
FIG. 1 is a diagram illustrating a commercial distribution related to a refrigerant leakage of an air conditioner according to an embodiment of the present disclosure.
Figure 2:
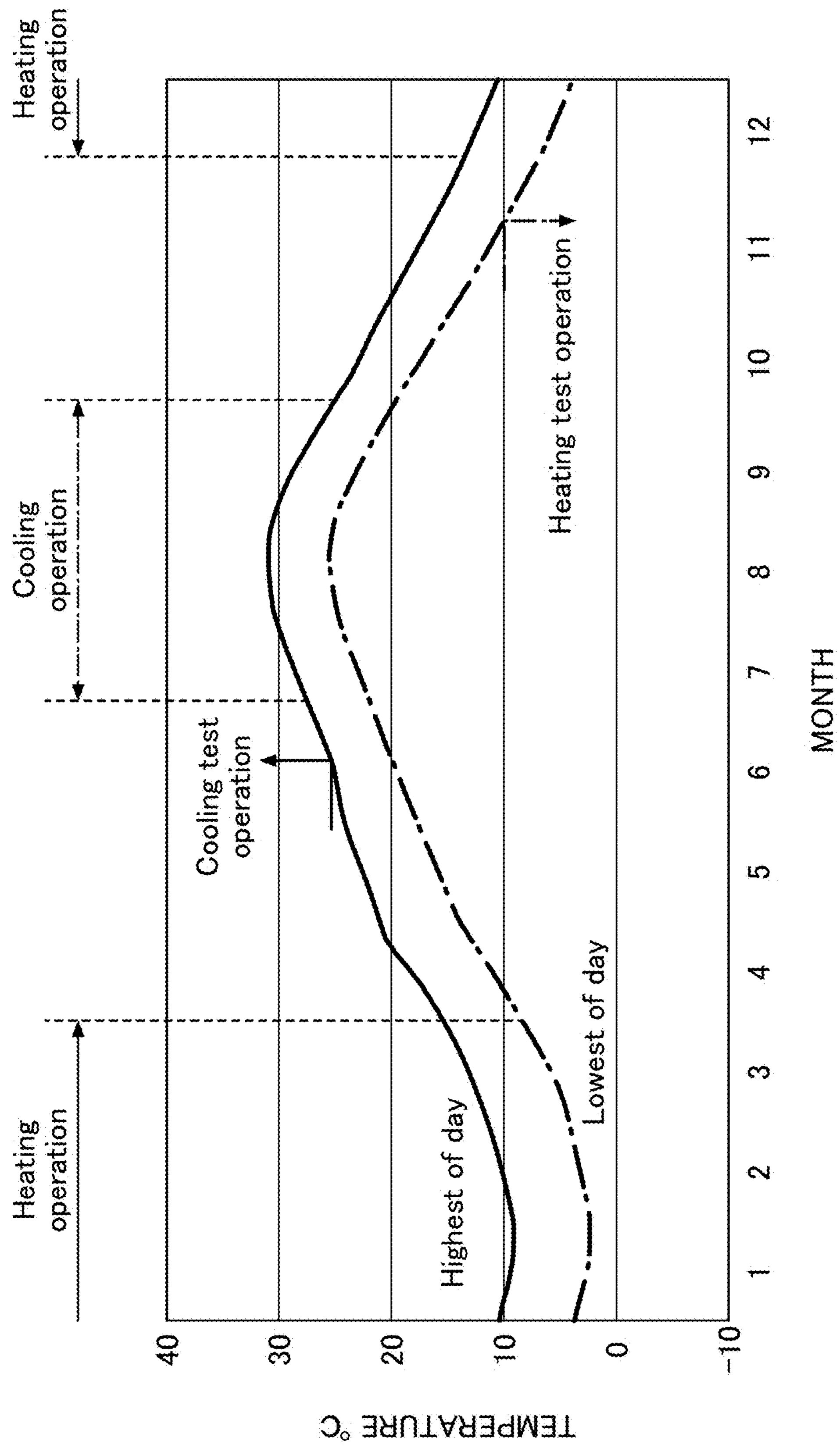
FIG. 2 is a diagram illustrating a start timing of a test operation before a full-scale heating and cooling operation in Japan.

First, a disclosure of the embodiments will be described with reference to FIG. 1 and FIG. 2. FIG. 1 is a diagram illustrating a commercial distribution related to a refrigerant leakage of an air conditioner according to an embodiment of the present disclosure. FIG. 2 is a diagram illustrating a start timing of a test operation before a full-scale heating and cooling operation.

As illustrated in FIG. 1, an air conditioner 7*a* of a user A, an air conditioner 7*b* of a user B, and an air conditioner 7*c* of a user C are connected to a remote management server 4 via the Internet or the like. The remote management server 4 remotely monitors the refrigerant leakage in the air conditioners 7*a*, 7*b*, and 7*c*, reports the leakage indicating the detected refrigerant leakage to the users A, B, and C of the air conditioners 7*a*, 7*b*, and 7*c*, respectively, and instructs a dealer (repair department) X to prompt the user of the air conditioner in which the refrigerant leakage occurred to repair the refrigerant leakage. The air conditioners 7*a*, 7*b*, and 7*c* are examples of an air conditioner 7, and any number of air conditioners 7 may be provided as long as the number is one or more. The users A, B, and C are examples of a user U, and any number of users U may be present as long as the number is one or more.

The remote management server 4 is managed by a manufacturer (maker) of the air conditioner 7, or a service provider that provides a leakage notification service. However, in the case of a large scale dealer, the remote management server 4 may be managed by a dealer X. The dealer X is a store or a contractor that sells the air conditioner 7 to the user, and has a repair department that is in charge of repairing the air conditioner 7.

Next, a commercial distribution related to the refrigerant leakage of the air conditioner will be described with reference to FIG. 1. FIG. 1 illustrates a situation in which the refrigerant leakage occurred in the air conditioner 7*a* of the user A, as a predetermined air conditioner.

S1: First, when the dealer X sells the air conditioner 7 to each user U, the user U desiring a repair warranty against the refrigerant leakage pays the dealer X a warranty fee for refrigerant leakage repair in addition to a sales price of the air conditioner 7. If a probability of the refrigerant leakage is 18 per year, the probability of the refrigerant leakage during a warranty validity period of 10 years is 108, and the warranty fee is approximately 1/100 of the required repair cost.

S2: In the case where the user U desires the repair warranty against the refrigerant leakage, each user U pays the warranty fee to a warranty provider Y via the dealer X. In addition, the dealer X registers warranty subscription information (refer to FIG. 8), in the remote management server 4.

S3: Each user U registers user information indicating information (refer to FIG. 6) related to the user U, and device information indicating information (refer to FIG. 7) related to the air conditioner 7, in the remote management server 4. In the case of a commercial refrigeration air conditioner, such information is the information that requires registration according to the Act on Rational Use and Appropriate Management of Fluorocarbons, and thus, a user workload will not increase by the registration of such information.

S4: The air conditioner 7 is originally provided with temperature sensors 72, 85*a*, 85*b*, or the like which will be described later, and the air conditioner 7 can determine a full-scale operation start timing by itself, and thus, the air conditioner 7 performs a test operation a certain time period before the full-scale operation start timing. For example, the air conditioner 7*a* determines whether or not there is a refrigerant leakage, and if there is a refrigerant leakage, the air conditioner 7*a* transmits a leakage notification (leakage call) to the remote management server 4.

Next, the timing of the test operation will be described with reference to FIG. 2. FIG. 2 is a diagram illustrating the start timing of the test operation before the heating and cooling operation in Japan (Tokyo, Osaka, or the like). As illustrated in FIG. 2, the air conditioner 7 performs a cooling test operation a certain time period before (for example, two weeks before) a general cooling operation period from mid June to mid September. The cooling test operation is started in a case where a highest temperature of the day exceeds a threshold value (for example, 25° C.). In addition, the air conditioner 7 performs a heating test operation a certain time period before (for example, two weeks before) a general heating operation period from late November to mid March. The heating test operation is started in a case where a lowest temperature of the day becomes lower than a threshold value (for example, 10° C.).

S5: Returning to the description of FIG. 1, the remote management server 4 reports the leakage indicating the detected refrigerant leakage to the user A of the air conditioner 7*a* which sent the leakage notification, as in the conventional case. Thus, the user A can recognize that the refrigerant leakage of the air conditioner 7*a* occurred. Furthermore, in the present embodiment, the remote management server 4 instructs the dealer X to prompt the user A to repair the air conditioner 7*a*. In this case, the user information of the user A, the device information related to the air conditioner 7*a*, and the warranty subscription information related to a leakage warranty specialized in refrigerant leakage repairs are also transmitted to the dealer X.

S6: The dealer X contacts the user A to inform the refrigerant leakage repair to be performed by applying the warranty, and adjusts a repair schedule, before making a repair response. If the refrigerant leakage occurs within the free warranty period (manufacturer's warranty period), the manufacturer bears the repair cost. Further, even if the refrigerant leakage occurs after a product warranty period expires, the warranty contractor bears the repair cost if the refrigerant leakage occurs within a leakage warranty period. In these cases, the dealer X notifies the user A that there is no user burden on the repair cost. Accordingly, by solving the problem of the user burden on the repair cost in advance, it becomes easier for the user to request the repair, and the repair can be performed before the timing of the full-scale heating and cooling operation.

S7: If the refrigerant leakage occurs outside the free warranty period (manufacturer's warranty period) but within the leakage warranty period, the dealer X reports completion of the repair to the warranty provider Y after the completing the repair, and receives a warranty fee from the warranty provider Y.

S8: Further, the dealer X registers repair history information in the remote management server 4.

As described above, by reducing a time from the time when the refrigerant leakage is detected until a time when the repair is completed by the commercial distribution of the processes S1 through S8, it is possible to reduce a leakage amount of the refrigerant.

[Overall Configuration of Refrigerant Leakage Repair System]

Next, an overall configuration of a refrigerant leakage repair system 1 will be described with reference to FIG. 3.

First, an outline of the configuration of the refrigerant leakage repair system according to the present embodiment will be described with reference to FIG. 3. FIG. 3 is an overall configuration diagram illustrating the refrigerant leakage repair system according to an embodiment of the present disclosure.

Figure 3:
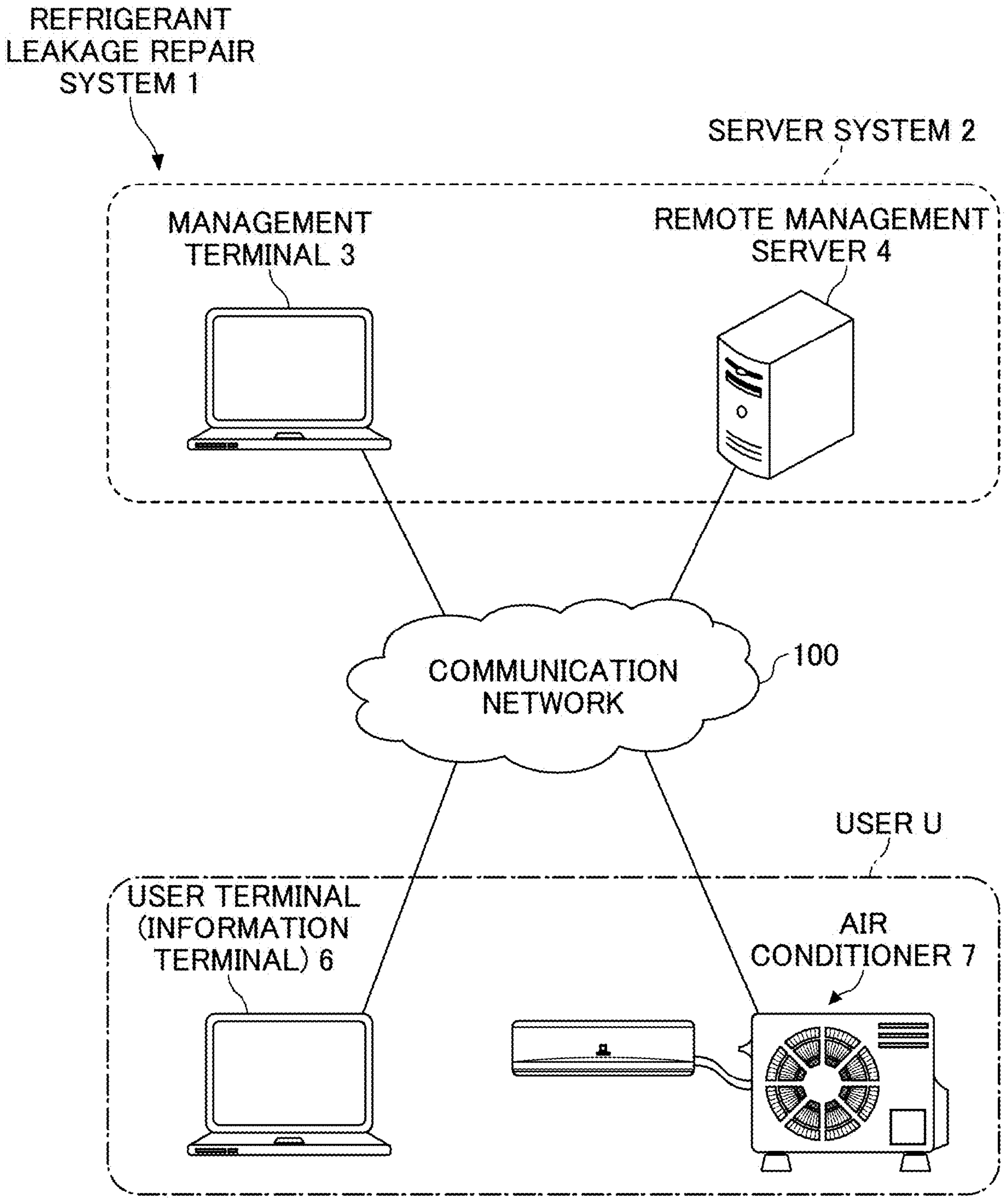
FIG. 3 is an overall configuration diagram illustrating a refrigerant leakage repair system according to an embodiment of the present disclosure.

As illustrated in FIG. 3, the refrigerant leakage repair system 1 according to the present embodiment is composed of a server system 2, a user terminal 6, and the air conditioner 7. The server system 2 is composed of a management terminal 3, and a remote management server 4. The management terminal 3, the remote management server 4, the user terminal 6, and the air conditioner 7 can communicate with one another by being connected to a communication network 100, such as the Internet or the like. A connection method of the communication network 100 may be wireless or wired.

The user terminal 6 and the air conditioner 7 are managed and used by the user U.

The management terminal 3 is a personal computer (PC) or the like, and transmits repair prompt information or the like prompting the repair to the user terminal 6, in response to an operation performed by a clerk of the dealer X or a person in charge of the repair department of the dealer X.

The remote management server 4 is composed of a single computer or a plurality of computers. As described above, the remote management server 4 is managed by the manufacturer (maker) of the air conditioner 7, or the service provider that provides the leakage notification service. However, in the case of a large-scale dealer, the remote management server 4 may be managed by the dealer X. The remote management server 4 remotely monitors the refrigerant leakage in the air conditioner 7, transmits leakage report information or the like indicating the occurrence of the refrigerant leakage to the user U of the air conditioner 7, and transmits, to the dealer X, repair prompt instruction information or the like indicating an instruction prompting the user U to perform the repair.

Figure 14:
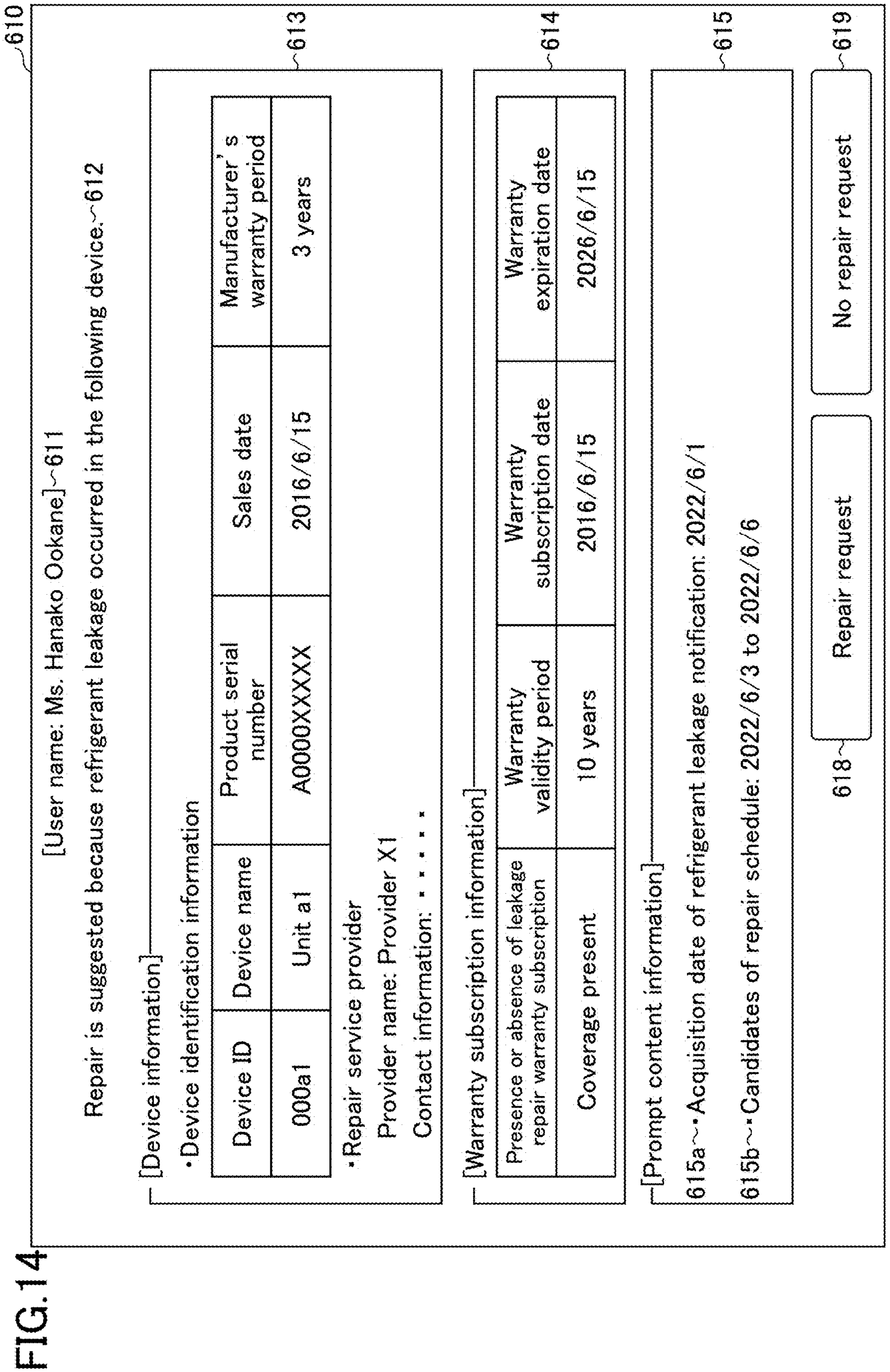
FIG. 14 is a diagram illustrating an example of a display screen displayed by the user terminal.
Figure 15:
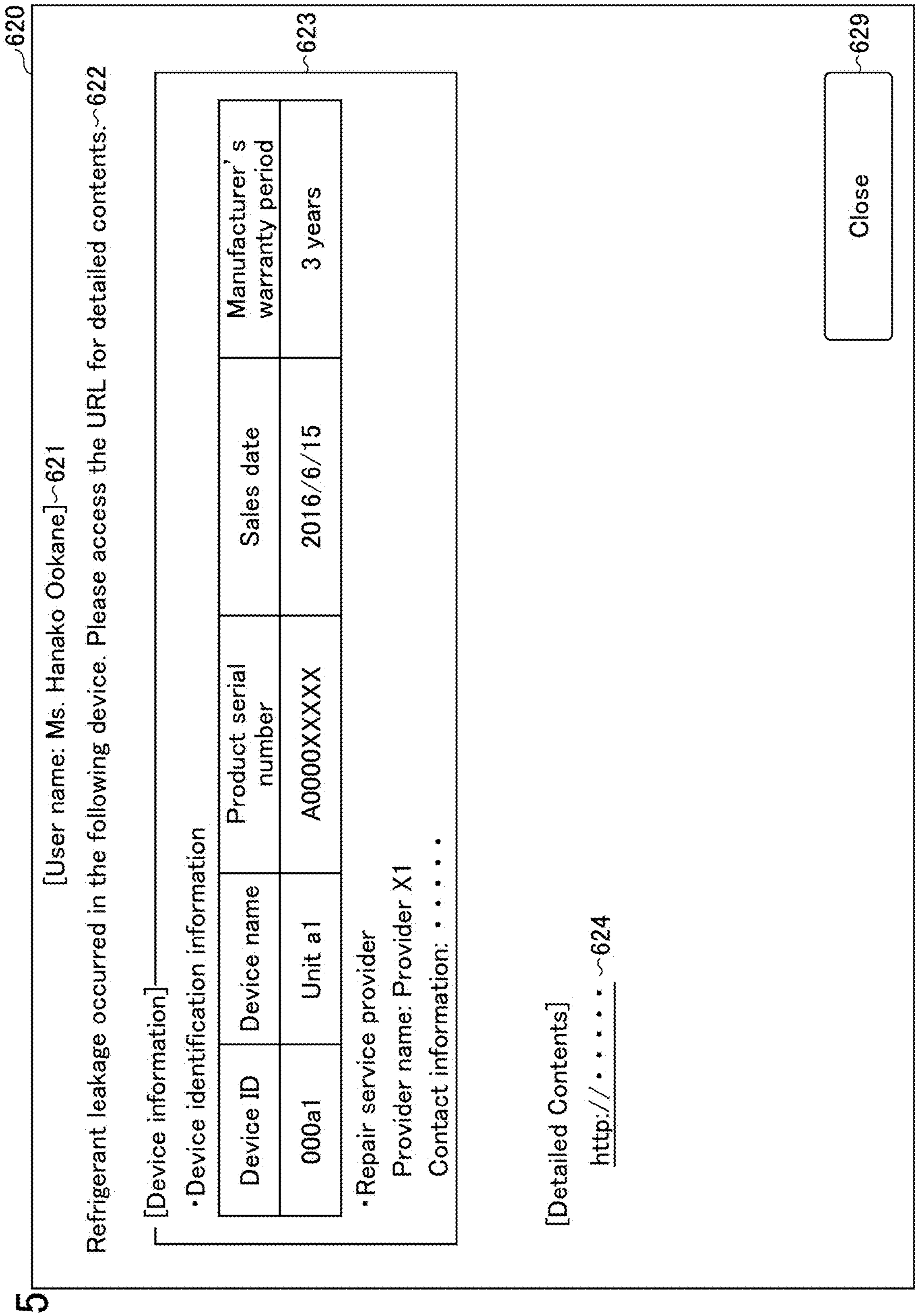
FIG. 15 is a diagram illustrating a modification of the display screen displayed by the user terminal.

The user terminal 6 is a PC or the like, and performs the processes of displaying a display screen 610 (620) as illustrated in FIG. 14 or FIG. 15 which will be described later, prompting the user U to select a repair request, or the like in response to receiving the repair prompt information prompting the repair from the management terminal 3.

As illustrated in FIG. 2, the air conditioner 7 automatically performs a test operation when a timing (day) for performing each of a cooling trial operation and a heating trial operation arrives, and transmits a leakage notification (leakage call) to the remote management server 4 in the case where the refrigerant leakage occurs.

[Each Configuration of Refrigerant Leakage Repair System]

Next, configurations of the management terminal 3, the remote management server 4, the user terminal 6, and the air conditioner 7, composing the refrigerant leakage repair system, will be described with reference to FIG. 4 through FIG. 10.

[Configurations of Management Terminal and User Terminal]

Figure 4:
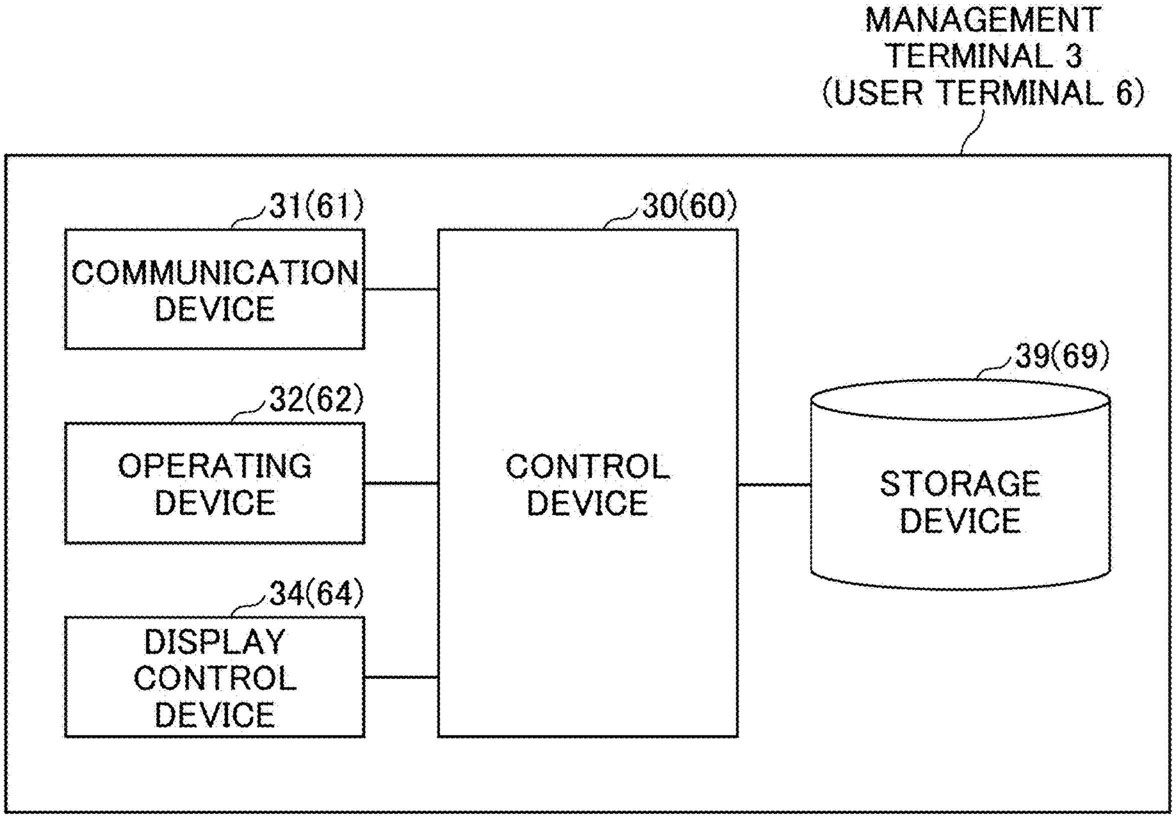
FIG. 4 is a diagram illustrating a schematic configuration of a management terminal and a user terminal.

First, a schematic configuration of the management terminal 3 will be described with reference to FIG. 4. FIG. 4 is a diagram illustrating a schematic configuration of the management terminal and the user terminal.

As illustrated in FIG. 4, the management terminal 3 includes a control device 30, a communication device 31, an operating device 32, a display control device 34, and a storage device 39.

Among these elements of the management terminal 3, the control device 30 controls the entire management terminal 3, and may be implemented by a processor. The processor may include various computational devices and electronic circuits, such as a central processing unit (CPU), a graphics processing unit (GPU), a field programmable gate array (FPGA), an application specific integrated circuit (ASIC), or the like. The processor may execute one or more programs stored in a hardware memory, such as a computer-readable recording medium, the storage device 39, or the like, thereby performing one or more processes of the control device 30.

The communication device 31 is a device configured to transmit and receive various kinds of information to and from other devices (terminals, servers) via the communication network 100. The communication device 31 may be implemented by a processor, similar to the control device 30.

The operating device 32 is a device configured to receive an operation from an operator via a keyboard, a mouse, or the like.

The display control device 34 is a device configured to display a screen on a display, such as a GPU, a display controller, or the like. The display control device 34 may be implemented by a processor, similar to the control device 30.

The storage device 39 is a device, such as a read only memory (ROM), a random access memory (RAM), a solid state drive (SSD), or the like.

The user terminal 6 includes a control device 60, a communication device 61, an operating device 62, a display control device 64, and a storage device 69, which have the same configurations as the control device 30, the communication device 31, the operating device 32, the display control device 34, and the storage device 39, respectively, and thus, a description thereof will be omitted. The communication device 61 may be implemented by a processor, similar to the control device 60.

<Configuration of Remote Management Server>

Figure 5:
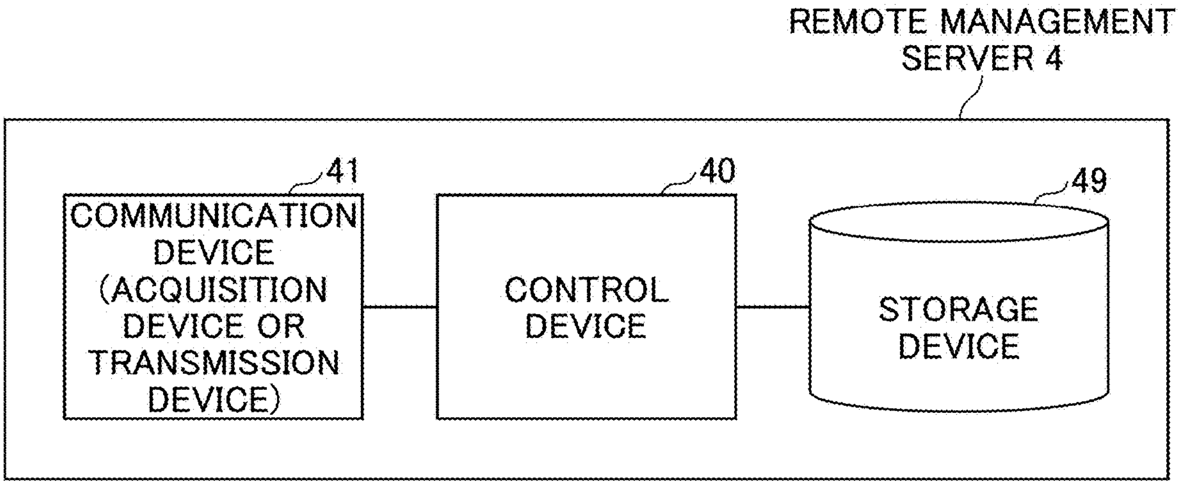
FIG. 5 is a diagram illustrating a schematic configuration of a remote management server.

Next, a schematic configuration of the remote management server 4 will be described with reference to FIG. 5. FIG. 5 is a diagram illustrating the schematic configuration of the remote management server.

As illustrated in FIG. 5, the remote management server 4 includes a control device 40, a communication device 41, and a storage device 49.

Among these elements of the remote management server 4, the control device 40 controls the entire remote management server 4, and may be implemented by a processor. The processor may include various computational devices and electronic circuits, such as a CPU, a GPU, an FPGA, an ASIC, or the like. The processor may execute one or more programs stored in a hardware memory, such as a computer-readable recording medium, the storage device 49, or the like, thereby performing one or more processes of the control device 40.

The communication device 41 is a device configured to transmit and receive various kinds of information to and from other devices (terminals, servers) via the communication network 100. The communication device 41 is an example of an acquisition device or a transmission device. The communication device 41 may be implemented by a processor, similar to the control device 40.

The storage device 39 is a device, such as a ROM, a RAM, an SSD, or the like. The storage device 39 stores and manages various tables which will be described below.

(User Information Management Table)

The storage device 39 stores a user information management table illustrated in FIG. 6. FIG. 6 is a conceptual diagram illustrating the user information management table. The user information management table manages the user information in which a user ID, a user name, contact information of the user, and an address (or a residence) of the user are associated with one another. The contact information of the user is an e-mail address of the user terminal, a telephone number of the user, or the like. At least one of the user ID, the user name, the contact information of the user, and the address (or the residence) of the user is an example of user identification information for identifying the user.

(Device Information Management Table)

The storage device 39 stores a device information management table illustrated in FIG. 7. FIG. 7 is a conceptual diagram illustrating the device information management table. The device information management table manages the device information in which device identification information and repair service provider information are associated with each other for each user ID.

The device identification information is the information for identifying the air conditioner, and includes a device ID, a device name, a product serial number, a product sale date, and a free warranty period (manufacturer's warranty period). At least one of the device ID, the device name, and the product serial number is an example of the device identification information for identifying the air conditioner.

The repair service provider information is the information for identifying a repair service provider who repairs a failure of the air conditioner 7 identified by the device ID, and includes information, such as a name of the repair service provider and contact information of the repair service provider, for example.

(Warranty Information Management Table)

The storage device 39 stores warranty information management tables illustrated in (a), (b), and (c) of FIG. 8. FIG. 8 is a conceptual diagram illustrating of each of the warranty information management tables. In FIG. 8, (a), (b), and (c) illustrate warranty information related to the air conditioners 7*a*, 7*b*, and 7*c* illustrated in FIG. 1, respectively. In FIG. 8, (a) illustrates a state in which the user A is subscribed to the leakage warranty and has completed the repair, (b) illustrates a state in which the user B is subscribed to the leakage warranty but has not completed the repair (or is attending to the repair but has not completed the repair), and (c) illustrates a state in which the user C is not subscribed to the leakage warranty. Although FIG. 8 illustrates three warranty information, the present disclosure is not limited thereto.

In the warranty information management table, warranty subscription information and repair history information are managed in association with each other for each device ID.

The warranty subscription information is the information indicating an extended warranty specialized in (dedicated to) the refrigerant leakage, different from the free warranty (manufacturer's warranty), and includes information such as a presence or absence of the leakage repair warranty subscription, a warranty validity period, a warranty subscription date, and a warranty expiration date. The information indicating the presence or absence of the leakage repair warranty subscription is managed as "presence" in a case where the user U desires the extended warranty specialized in the refrigerant leakage, and is managed as "absence" in a case where the user U does not desire the extended warranty.

The repair history information is the information indicating a history for a case where the refrigerant leakage is repaired utilizing the extended warranty specialized in the refrigerant leakage, and includes information such as a repair response date, a warranty fee, and a response content. The warranty fee indicates an amount paid by the warranty provider Y.

<Configuration of Air Conditioner>

Next, a schematic configuration of a refrigerant circuit of the air conditioner 7 will be described with reference to FIG. 9, and a schematic configuration of a communication system of the air conditioner 7 will be described with reference to FIG. 10.

(Configuration of Refrigerant Circuit of Air Conditioner)

Figure 9:
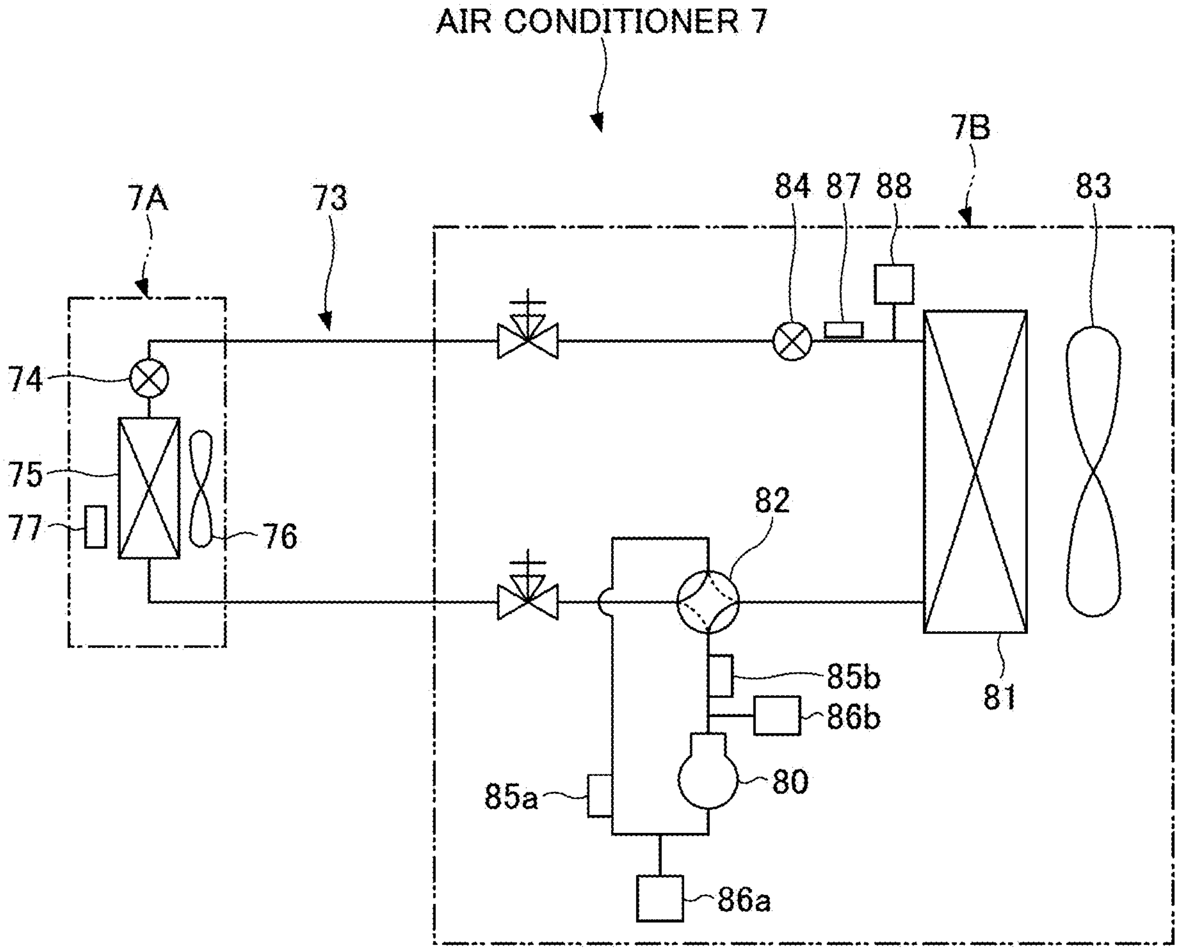
FIG. 9 is a diagram illustrating a schematic configuration of a refrigerant circuit of the air conditioner.

FIG. 9 is a diagram illustrating the schematic configuration of the refrigerant circuit of the air conditioner. The air conditioner 7 illustrated in FIG. 9 is a separate type having an indoor unit 7A and an outdoor unit 7B, but is not limited to this type.

The indoor unit 7A and the outdoor unit 7B are connected to via a refrigerant pipe 73. The refrigerant circuit is configured to perform a vapor compression refrigeration cycle by circulating the refrigerant flowing through the refrigerant pipe 73. The indoor unit 7A includes an indoor expansion valve 74, an indoor heat exchanger 75, and an indoor fan 76. An electric expansion valve capable of adjusting a refrigerant pressure and a refrigerant flow rate is used as the indoor expansion valve 74.

The indoor heat exchanger 75 is a cross-fin type tube heat exchanger, for example, and is used for exchanging heat with indoor air. The indoor fan 76 is configured to draw the indoor air into the indoor unit 7A, perform a heat exchange between the air drawn in and the indoor heat exchanger 75, and thereafter blow the air into a room. The indoor fan 76 includes a motor having an operating rotational speed thereof adjustable by an inverter control.

The indoor unit 7A further includes various sensors. For example, the indoor unit 7A includes a temperature sensor 77. The temperature sensor 77 detects a temperature of the air drawn into the indoor unit 7A by the indoor fans 76. A detection signal of the temperature sensor 77 is input to a control device 70 (refer to FIG. 10) which will be described later.

Operations of the indoor expansion valve 74 and the indoor fan 76 are controlled by the control device 70, according to an on or off operation of an operation switch of the air conditioner 7 and outputs of the various sensors.

The outdoor unit 7B includes a compressor 80, an outdoor heat exchanger 81, a four-way switching valve 82, an outdoor fan 83, and an outdoor expansion valve 84.

The compressor 80 is a variable displacement compressor (variable capacity compressor), and can vary an operating rotational speed of a built-in motor by an inverter control of this motor. However, the compressor 80 may be a fixed displacement compressor. Further, a plurality of compressors 80 may be provided. In this case, the variable displacement compressor and the fixed displacement compressor may coexist.

The outdoor heat exchanger 81 is a cross-fin type tube heat exchanger, for example, and is used for exchanging heat with the refrigerant using the air as a heat source. The outdoor fan 83 includes a motor having an operating rotational speed thereof adjustable by an inverter control. The outdoor fan 83 is configured to draw outdoor air into the outdoor unit 7B, perform a heat exchange between the air drawn in and the outdoor heat exchanger 81, and thereafter blow the air outside the outdoor unit 7B.

The four-way switching valve 82 reverses the flow of the refrigerant in the refrigerant pipe 73, and switches and supplies the refrigerant discharged from the compressor 80 to the outdoor heat exchanger 81 and the indoor heat exchanger 75. Thus, the air conditioner 7 can switch between the cooling operation and the heating operation.

The outdoor unit 7B further includes various sensors. For example, the outdoor unit 7B includes temperature sensors 85*a*, 85*b*, and 87, and pressure sensors 86*a*, 86*b*, and 88. The temperature sensor 85*a* is provided in an intake pipe of the compressor 80, and detects an intake pipe temperature. The temperature sensor 85*b* is provided in a discharge pipe, and detects a discharge pipe temperature. The temperature sensor 87 is provided in the refrigerant pipe 73 in front of the outdoor expansion valve 84, and detects a refrigerant pipe temperature. The pressure sensor 86*a* is provided on a suction side of the compressor 80, and detects low pressures. The pressure sensor 86*b* is provided on a discharge side of the compressor 80, and detects high pressures. The pressure sensor 88 is provided in the refrigerant pipe 73 in front of the outdoor expansion valve 84, and detects a refrigerant pressure. Further, the temperature sensor may be a sensor for measuring temperatures on a gas side and a liquid side of the outdoor heat exchanger 81.

Detection signals of the temperature sensors 85*a* and 85*b* and the pressures sensors 86*a* and 86*b* are input to the control device 70 (refer to FIG. 10) which will be described later.

Operations of the compressor 80, the outdoor fan 83, and the outdoor expansion valve 84 are controlled by the control device 70 according to the outputs of the various sensors.

(Configuration of Communication System of Air Conditioner)

Figure 10:
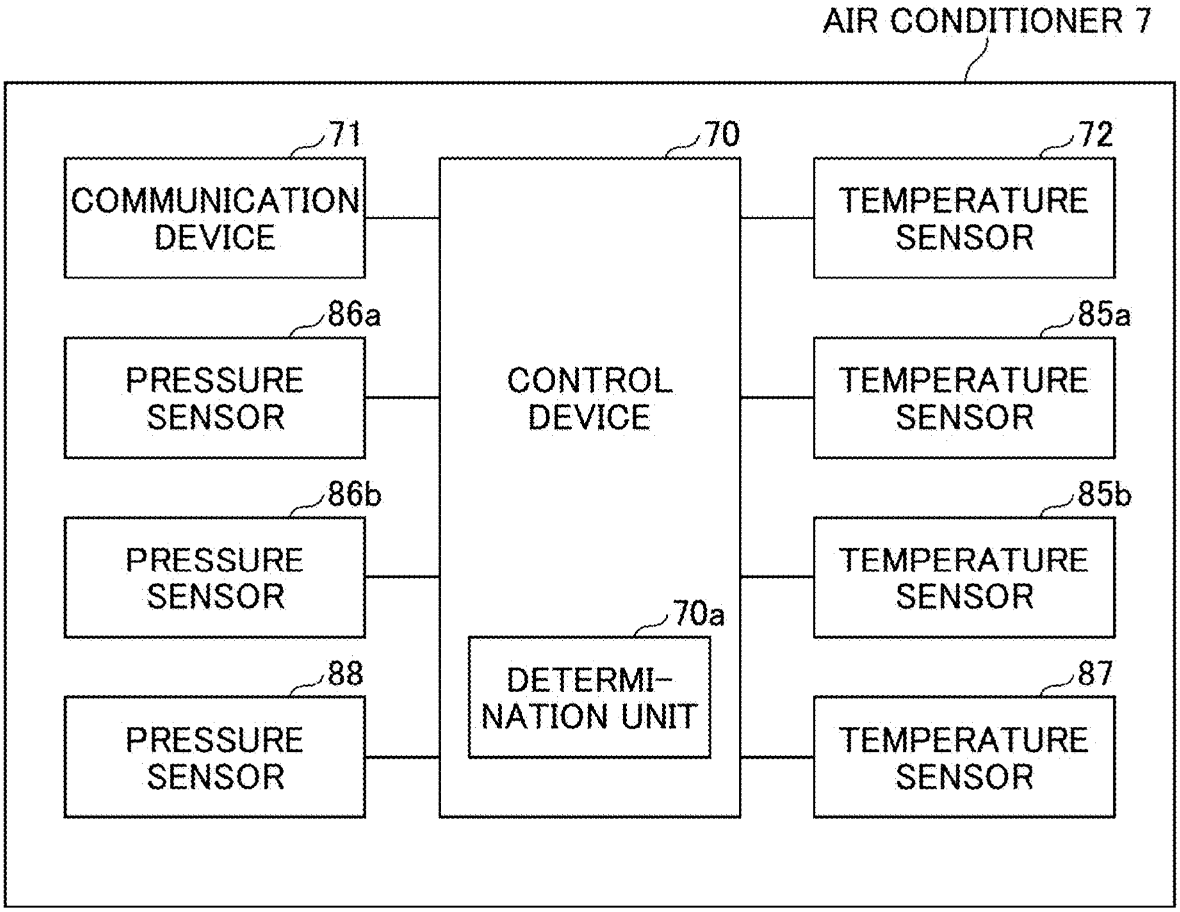
FIG. 10 is a diagram illustrating a schematic configuration of a communication system of the air conditioner.

FIG. 10 is a diagram illustrating a schematic configuration of a communication system of the air conditioner.

As illustrated in FIG. 10, the air conditioner 7 includes the control device 70, the temperature sensor 77, the temperature sensor 85*a*, the temperature sensor 85*b*, the pressure sensor 86*a*, and the pressure sensor 86*b*. The temperature sensor 77, the temperature sensor 85*a*, the temperature sensor 85*b*, the temperature sensor 87, the pressure sensor 86*a*, the pressure sensor 86*b*, and the pressure sensor 88 are examples of a detector (or a detection means), and are described above with reference to FIG. 9, and thus, a description thereof will be omitted.

The control device 70 controls the entire air conditioner 7, and may be implemented by a processor. The processor may include various computational devices and electronic circuits, such as a CPU, a GPU, an FPGA, an ASIC, or the like. The processor may execute one or more programs stored in a hardware memory, such as a computer-readable recording medium, a storage device, or the like, thereby performing one or more processes of the control device 70. In addition, the control device 70 functionally includes a determination unit 70*a*. In other words, the processor of the control device 70 may include an electronic circuit (determination circuit) configured to perform an operation of the determination unit 70*a* described below.

The determination unit 70*a* determines the presence or absence of the refrigerant leakage according to an output signal (detection result) of at least one sensor among the temperature sensor 77, the temperature sensor 85*a*, the temperature sensor 85*b*, the pressure sensor 86*a*, and the pressure sensor 86. There are various methods for determining the presence or absence of the refrigerant leakage, and for example, the determination unit 70*a* may determine the presence or absence of a leakage detection by measuring an amount of the refrigerant based on a pressure difference between the suction pressure (low pressure) that is a detection result of the pressure sensor 86*a* and a discharge pressure (high pressure) that is a detection result of the pressure sensor 86*b*.

The communication device 71 is a device configured to transmit and receive various kinds of information to and from other devices (terminals and servers) via the communication network 100. In a case where the communication device 71 performs a wireless communication, data (information) is transmitted utilizing a specific low power wireless communication called Low Power Wide Area (LPWA). This specified low power wireless communication achieves a long distance communication at a low power consumption, unlike a wireless communication system for performing a high-speed communication at a relatively high power, such as a 4G network or a 5G network provided by a mobile phone service provider. In the case of the LPWA, the communication network 100 includes a SigFog network, for example. The SigFog network can transfer 12 bytes of data each time at a data transfer rate of 100 bps, up to 140 times per day at a maximum (approximately 50 kB per month). At present, the SigFog network can be utilized at approximately several hundred yen per year, and the communication can be performed at a very low power. However, the network is not limited to the SigFog network, and other networks for specific low power wireless communication may be used.

[Processes or Operations of Refrigerant Leakage Repair System]

Next, processes or operations of the refrigerant leakage repair system 1 will be described with reference to FIG. 11 through FIG. 16. A dedicated application that enables the management terminal 3, the remote management server 4, and the user terminal 6 to communicate with one another is installed in each of the management terminal 3, the remote management server 4, and the user terminal 6. In addition, a dedicated application that enables the air conditioner 7 and the remote management server 4 to communicate with each other is installed in each of the air conditioner 7 and the remote management server 4.

<Procedures of Warranty Subscription for Refrigerant Leakage>

Figure 11:
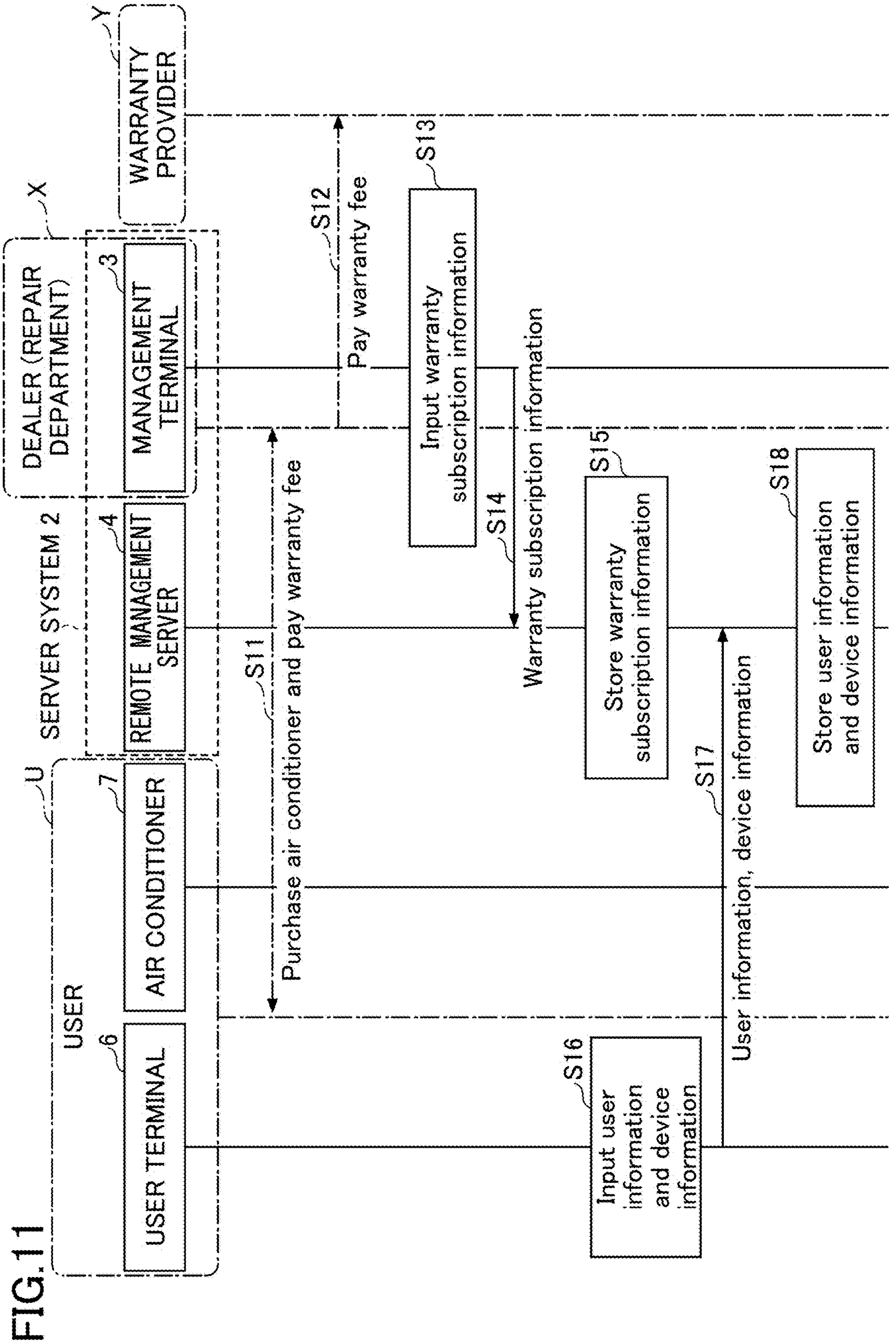
FIG. 11 is a sequence diagram illustrating procedures and processes of a warranty subscription for the refrigerant leakage of the air conditioner.

First, procedures and processes of a warranty subscription for the refrigerant leakage of the air conditioner 7 will be described with reference to FIG. 11. FIG. 11 is a sequence diagram illustrating the procedures and the processes of the warranty subscription for the refrigerant leakage of the air conditioner.

S11: The user U purchases the air conditioner 7 from the dealer X, and pays a warranty fee for subscribing to the leakage warranty (extended warranty of refrigerant leakage) to the dealer X.

S12: The dealer X pays the warranty fee received from the user U to the warranty provider Y.

S13: The operating device 32 of the management terminal 3 receives an input of warranty subscription information from the clerk of the dealer X.

S14: The communication device 31 of the management terminal 3 transmits the warranty subscription information received by the operating device 32 to the remote management server 4. Thus, the communication device 41 of the remote management server 4 receives the warranty subscription information. In this case, the management terminal 3 transmits the device identification information for identifying the air conditioner 7 subscribed to the warranty to the remote management server 4 together with the warranty subscription information.

S15: The control device 40 of the remote management server 4 stores the warranty subscription information received by the communication device 41 in the storage device 49. As illustrated in FIG. 8, the warranty subscription information is stored in a table format in association with the device identification information (device ID in the example of FIG. 8).

S16: On the other hand, the operating device 62 of the user terminal 6 receives an input of the user information of the user U and the device information of the air conditioner 7 purchased in step S11 described above from the user U. At this point in time, the repair history information is not yet stored.

S17: The communication device 61 of the user terminal 6 transmits the user information and the device information received by the operating device 62 to the remote management server 4. Hence, the communication device 41 of the remote management server 4 receives the user information and the device information.

S18: The control device 40 of the remote management server 4 stores the user information and the device information received by the communication device 41 in the storage device 49. The user information is stored in a table format as illustrated in FIG. 6, and the device information is stored in a table format as illustrated in FIG. 7.

Accordingly, the procedures and processes of the warranty subscription of the air conditioner 7 are completed in the manner described above.

<Leakage Notification, Repair Request, and Repair Response>

Figure 12:
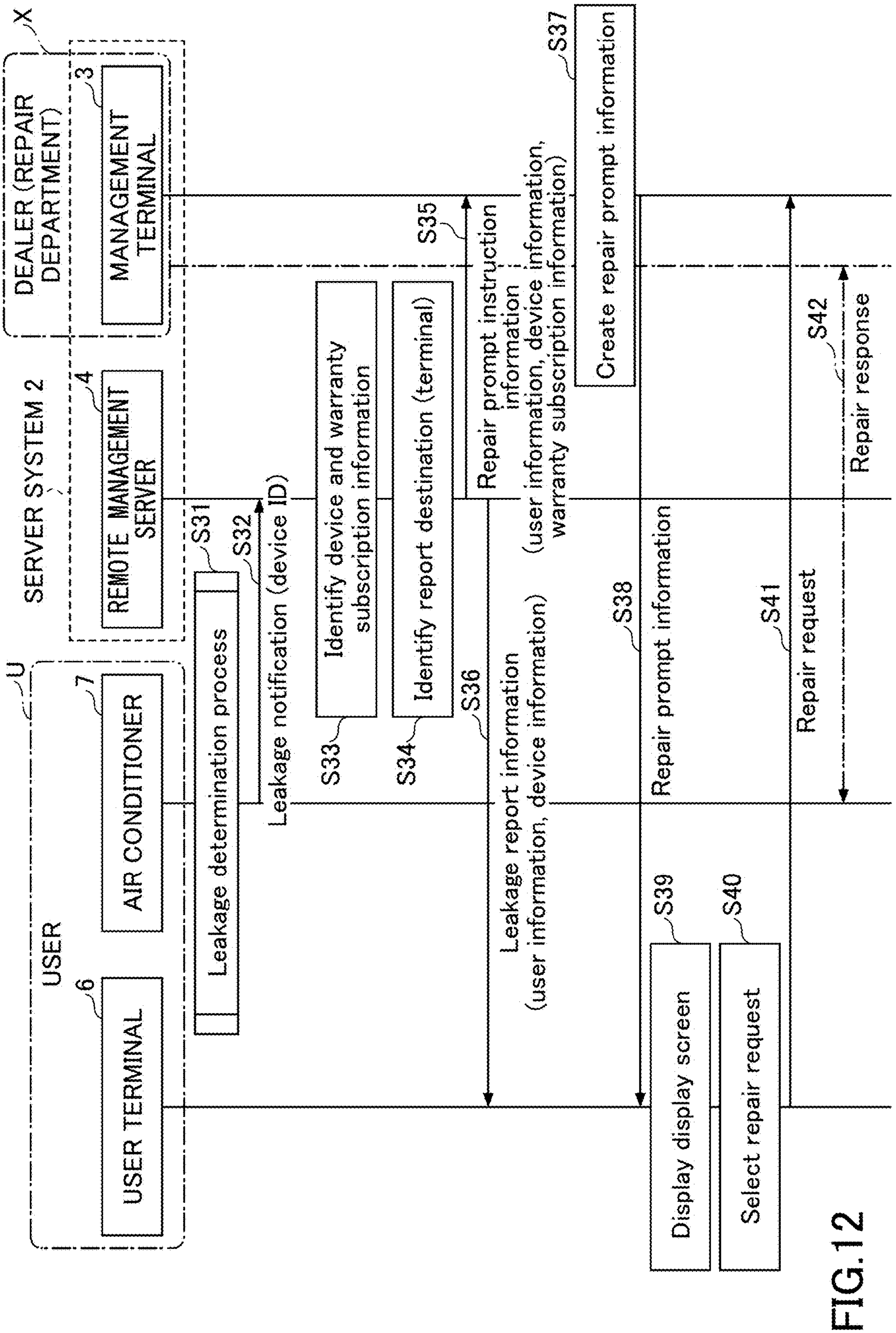
FIG. 12 is a sequence diagram illustrating processes of a leakage notification and a repair request of the air conditioner, and a repair response.

Next, processes of the leakage notification and the repair request of the air conditioner, and the repair response will be described with reference to FIG. 12 through FIG. 15. FIG. 12 is a sequence diagram illustrating the processes of the leakage notification and the repair request of the air conditioner, and the repair response.

Figure 13:
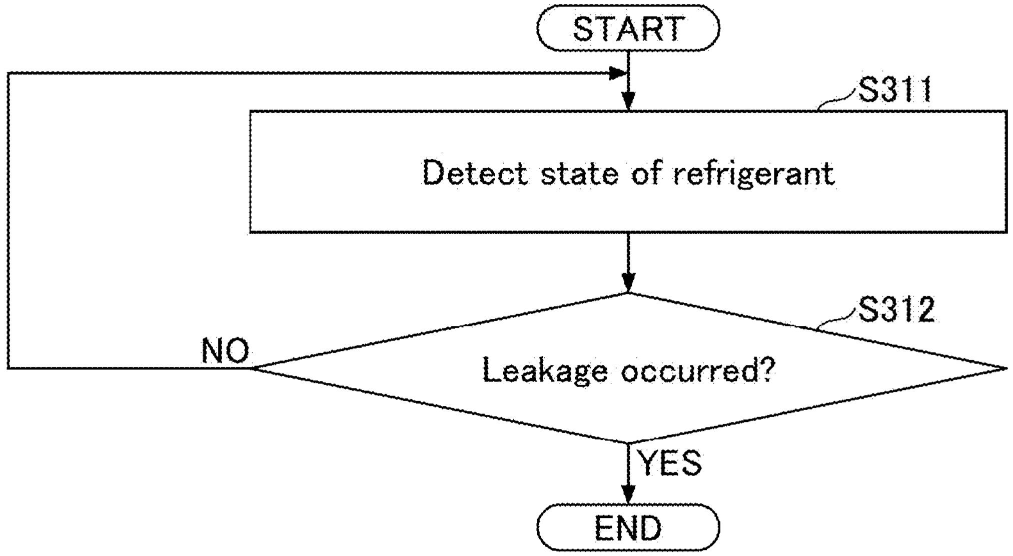
FIG. 13 is a flow chart illustrating a leakage determination process.

S31: The air conditioner 7 performs a leakage determination process. Next, the leakage determination process will be described with reference to FIG. 13. FIG. 13 is a flow chart illustrating the leakage determination process.

S311: One of the sensors detects the state of the refrigerant. As a method of detecting the state of the refrigerant during the cooling operation, there is a method of determining the refrigerant leakage state when a refrigerant subcooling temperature obtained from a difference between a refrigerant saturation temperature obtained from the pressure sensor 88 and a temperature in front of the expansion valve obtained from the temperature sensor 87 becomes smaller than a threshold value, for example, in addition to the method described above. Moreover, there is a method of determining the refrigerant leakage state when the of a refrigerant superheat temperature obtained from a difference between the refrigerant saturation temperature obtained from the pressure sensor 86*a* and the suction temperature of the compressor 80 obtained from the temperature sensor 85*a* becomes greater than a threshold value. Further, there is a method of determining the refrigerant leakage state when the refrigerant superheat temperature obtained from a difference between the refrigerant saturation temperature obtained from the pressure sensor 86*b* and the discharge temperature of the compressor 80 obtained from the temperature sensor 85*b* becomes greater than a value corresponding to the operating state. However, the method of determining the refrigerant leakage state is not limited to those described above, and there is also a method of comprehensively detecting the refrigerant leakage state including the indoor and outdoor temperatures, the rotational speed of the compressor 80, or the like in addition to the values obtained by the various sensors.

S312: The determination unit 70*a* determines the presence or absence of the refrigerant leakage according to the detection result of at least one sensor among the various sensors, and in a case where the refrigerant leakage does not occur (NO in S312), the process returns to the process of step S311. On the other hand, in a case where the refrigerant leakage occurs (YES in S312), the process advances to a next process of step S32.

S32: Returning to the description of FIG. 12, the communication device 71 transmits a leakage notification indicating that the refrigerant leakage is detected to the remote management server 4. The leakage notification includes the device ID for identifying the air conditioner 7 that is a transmission source. Thus, the communication device 41 of the remote management server 4 receives the leakage notification.

S33: The control device 40 of the remote management server 4 searches each device information management table (refer to FIG. 7) using the device ID received by the communication device 41 as a search key, thereby identifying the corresponding device information. The control device 40 also identifies the user ID of the user U of the air conditioner 7 indicated by the device ID. Further, the control device 40 searches each warranty information management table (refer to FIG. 8) using the device ID received by the communication device 41 as a search key, thereby identifying the corresponding warranty subscription information.

S34: Further, the control device 40 searches the user information management table (FIG. 6) using the user ID identified in the process of step S33 as a search key, thereby identifying the contact information of the corresponding user. Thus, it is possible to identify a report destination of the leakage report information.

S35: The communication device 41 transmits, to the management terminal 3 of the dealer, repair prompt instruction information indicating an instruction prompting the user U to perform the repair. The repair prompt instruction information includes the information (user information, device information, and warranty subscription information) identified in the processes of steps S33 and S34. The communication device 31 of the management terminal 3 receives the repair prompt instruction information.

S36: The communication device 41 of the remote management server 4 transmits the leakage report information indicating the report of the detected the refrigerant leakage to the user terminal 6 at the report destination identified in the process of step S34. The leakage report information includes the information (user information and device information) identified in the processes of steps S33 and S34. Thus, the user U can recognize that the leakage occurred as a first report.

S37: The operating device 32 of the management terminal 3 accepts creating the repair prompt information prompting the repair from the clerk of the dealer X that receives the instruction prompting the repair.

S38: The communication device 31 of the management terminal 3 transmits the repair prompt information created by the operating device 32 to the user terminal 6 at the contact information of the user information received in the process of step S35. Thus, the communication device 61 of the user terminal 6 receives the repair prompt information. In the process of step S36, the communication device 41 may include the warranty subscription information in the leakage report information, and transmit the leakage report information to the user terminal 6. In this case, before the process of step S36, the remote management server 4 accepts creating the repair prompt information, similar to the process of step S37, and in the process of step S36, the communication device 41 transmits the created repair prompt information to the user terminal 6. In this case, the repair is prompted solely by the remote management server 4 instead of by the server system 2, and the process of steps S35, S37, and S38 may be omitted.

S39: The display control device 64 of the user terminal 6 causes the display of the user terminal 6 or an external display to display the display screen 610 illustrated in FIG. 14. The display screen 610 will be described with reference to FIG. 14. FIG. 14 is a diagram illustrating an example of the display screen displayed by the user terminal.

As illustrated in FIG. 14, user identification information 611, such as the user name or the like, a comment 612 for prompting the repair, a device information display field 613, a warranty subscription information display field 614, and a prompt content information display field 615 are displayed on the display screen 610. The user identification information 611 is information created based on the user information received in the process of step S35. In this example, the user name of the user A is indicated as a predetermined user. The user identification information may be the user ID instead of the user name, or may be both the user ID and the user name. In addition, the user identification information may include the contact information and address of the user U. Further, the comment 612 prompting the repair is an example, and a content thereof is not limited to the content illustrated in FIG. 14 as long as the content prompts the repair.

The comment 612 for prompting the repair is information created by the clerk of the dealer X in the process of step S37. The comment 612 does not need to be created by the clerk of the dealer X, and a fixed phrase prepared in advance may be set automatically.

The device information received in the process of step S35 is displayed in the device information display field 613. The warranty subscription information received in the process of step S35 is displayed in the warranty subscription information display field 614. The information created by the clerk of the dealer X in the process of step S37 is displayed in the prompt content information display field 615. The prompt content information includes information 615*a* indicating a date and time when the leakage notification is acquired, and information 615*b* indicating candidates of a repair schedule for the refrigerant leakage by the dealer (repair service provider).

In addition, a "repair request" button 618 to be manipulated by the user when requesting the repair to the dealer (repair department), and a "no repair request" button 619 to be manipulated by the user when not requesting the repair to the dealer (repair department) are displayed in a lower part of the display screen 610. The "repair request" button 618 is an example of a repair request device (or a repair request means).

S40: When the user U selects the "repair request" button 618, the operating device 62 receives the selection of the repair request.

S41: Based on receiving the selection of the repair request by the operating device 62, the communication device 61 transmits a reply indicating a repair request to the management terminal 3, as a response to the process of step S38. Thus, the communication device 31 of the management terminal 3 receives the repair request. In a case where the "no repair request" button 619 is selected in the process of step S40, the communication device 61 transmits a reply indicating that no repair will be performed to the management terminal 3, as a response to the process of step S38, or does not transmit a reply.

S42: In the case where the management terminal 3 receives the reply indicating the repair request, the repair department of the dealer, as the repair service provider, attends to the repair of the air conditioner 7.

FIG. 15 illustrates a modification of the display screen of FIG. 14. FIG. 15 is a diagram illustrating the modification of the display screen displayed by the user terminal.

As illustrated in FIG. 15, user identification information 621, such as the user ID or the like, a comment 622 prompting the repair, a device information display field 623, and a URL 624 to be selected when viewing detailed contents are displayed on the display screen 620. The user identification information 621 has a content similar to that of the user identification information 611. The comment 622 for prompting the repair is a comment indicating that the URL 624 is to be accessed because the refrigerant leakage occurred. The device information display field 623 has a content similar to that of the device information display field 613. The URL 624 is information to be accessed in order to display another display screen, such as a display screen including the warranty subscription information display field 614 and the prompt content information display field 615 of FIG. 14. This other display screen also includes the "repair request" button 618 and the "no repair request" button 619 illustrated in FIG. 14. In addition, a "close" button 629 for closing the display screen 620 is displayed in the lower part of the display screen 620.

Although the device information display field 623 is displayed in FIG. 15, this device information display field 623 may also be displayed on the other display screen. In a case where the user terminal 6 receives the user identification information 621, the comment 622 prompting the repair, and the URL 624 by other than a dedicated application, the user identification information 621, the comment 622 prompting the repair, and the URL 624 may be sent by e-mail and received by the user terminal 6.

Accordingly, the processes of the leakage notification and the repair request of the air conditioner, and the repair response are completed in the manner described above.

<Procedures and Processes after Repair Response>

Figure 16:
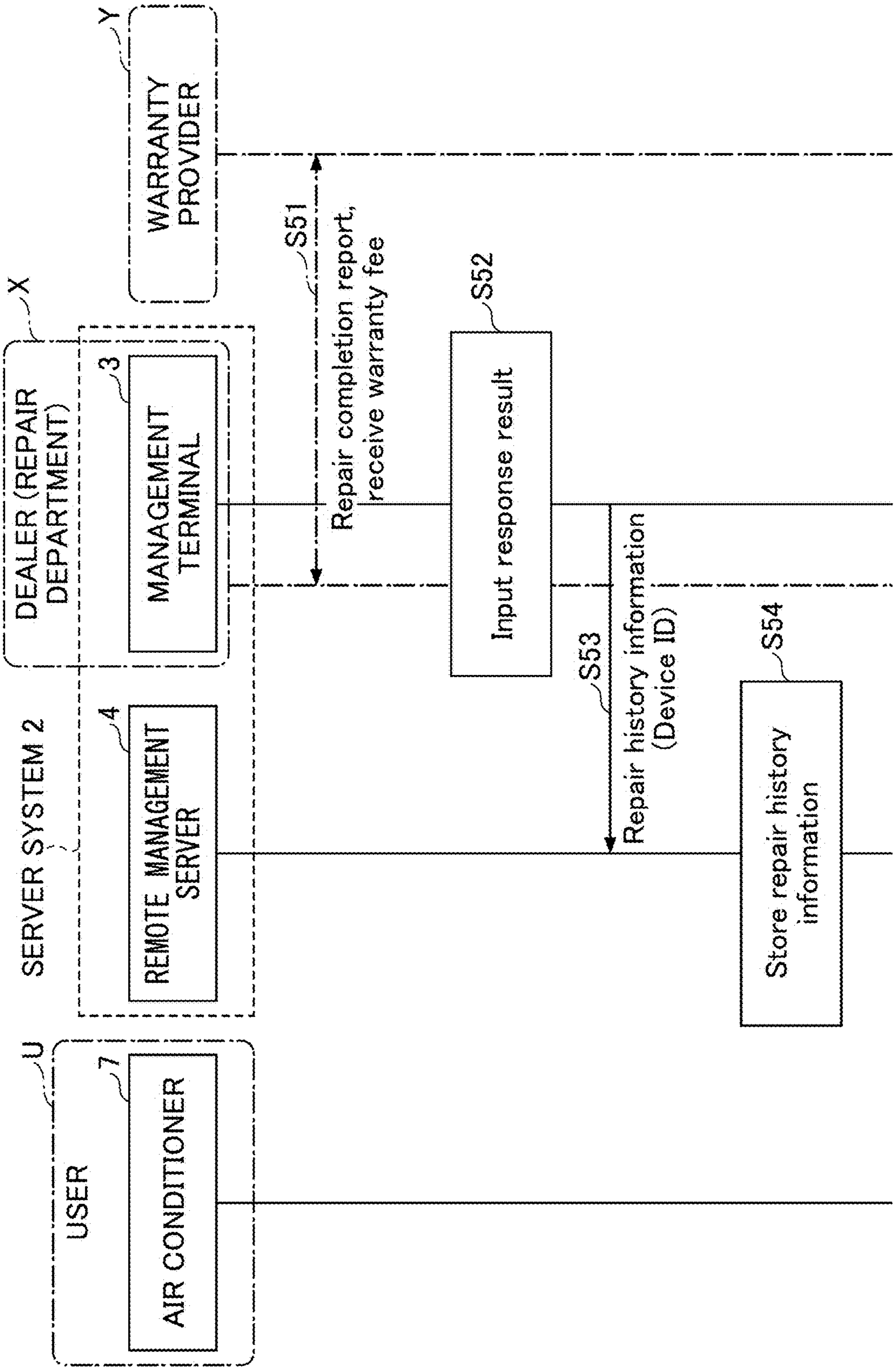
FIG. 16 is a sequence diagram illustrating procedures and processes after the repair response for the air conditioner.

Next, procedures and processes after the repair response for the air conditioner 7 will be described with reference to FIG. 16. FIG. 16 is a sequence diagram illustrating the procedures and processes after the repair response for the air conditioner.

S51: After the repair response, the dealer X makes a repair completion report to the warranty provider Y, and receives a warranty fee from the warranty provider Y.

S52: The operating device 32 of the management terminal 3 receives an input of a repair response result from the clerk of the dealer X. A repair response date, the warranty fee received from the warranty provider Y, and a repair response content are input as the response result. In this case, the device ID for identifying the air conditioner 7 to be repaired is also input.

S53: The communication device 31 of the management terminal 3 transmits the repair history information including the content received by the operating device 32 to the remote management server 4. The repair history information includes the device ID input in the process of step S52. Thus, the communication device 41 of the remote management server 4 receives the repair history information.

S54: The control device 40 of the remote management server 4 searches the warranty information management table (refer to FIG. 8) using the device ID received by the communication device 41 as a search key, thereby identifying the warranty information management table of the device ID and storing the repair history information received by the communication device 41.

Accordingly, the procedures and processes after the repair response for the air conditioner are completed in the manner described above.

[Modification of Commercial Distribution]

Figure 17:
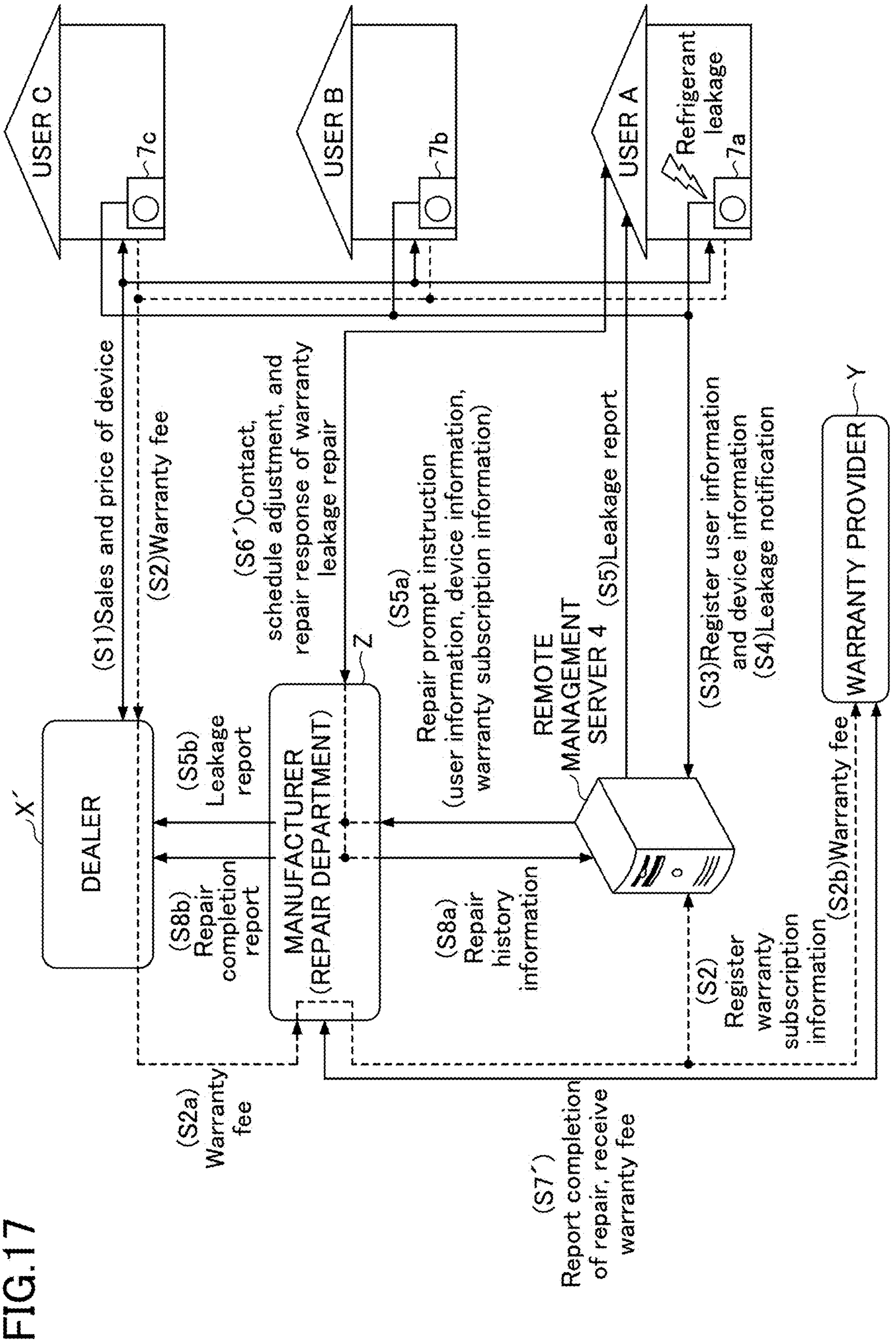
FIG. 17 is a diagram illustrating a modification of the commercial distribution related to the refrigerant leakage of the air conditioner.

Although FIG. 1 illustrates the commercial distribution related to the refrigerant leakage of the air conditioner 7, a modification of the commercial distribution will be described with reference to FIG. 17. FIG. 17 is a diagram illustrating a modification of the commercial distribution related to the refrigerant leakage of the air conditioner.

In the modification illustrated in FIG. 17, instead of a newly appearing manufacturer (repair department) Z, a dealer X' having no repair department appears. Because the dealer X' often desires to grasp the repair information of the user U without fail in order to continue the relationship with the user U, the flow of information illustrated in FIG. 17 occurs. In FIG. 17, the processes or procedures that are the same as those in FIG. 1 are designated by the same reference numerals, and a description thereof will be omitted.

In the case of this modification, the process of step S2 in FIG. 1 is a two-stage process of steps S2*a* and S2*b*, the process of step S5 in FIG. 1 is a two-stage process of steps S5*a* and S5*b*, and the process of step S8 in FIG. 1 is a two-stage process of steps S8*a* and S8*b*.

That is, in the case where the user U desires the repair warranty against the refrigerant leakage, the warranty fee is paid from each user U to the dealer X' (S2*a*), and from the manufacturer Z to the warranty provider Y (S2*b*).

In addition, the remote management server 4 sends a repair prompt instruction to the manufacturer Z (S5*a*), and the manufacturer Z sends a leakage report to the dealer (S5*b*). In this case, because the manufacturer Z repairs the refrigerant leakage, the manufacturer Z contacts the user A to inform the repair of the refrigerant leakage by applying the warranty, adjusts a repair schedule, and then makes the repair response (S6'). Further, in the case where the repair is not within the free warranty period (manufacturer's warranty period) but within the leakage warranty period, the manufacturer Z makes the repair completion report to the warranty provider Y after the repair is completed, and receives the warranty fee from the warranty provider Y (S7').

Moreover, the manufacturer Z registers the repair history information in the remote management server 4 (S8*a*), and the manufacturer Z makes the repair completion report to the dealer X' (S8*b*).

The modification of the commercial distribution related to the refrigerant leakage of the air conditioner is as described above.

Effects of Embodiment (1) As described above, according to the present embodiment, the server system 2 notifies the user terminal 6 of not only a need of the repair but also the presence or absence of the warranty subscription, thereby eliminating user's concerns regarding the repair cost and prompting the user U of the air conditioner 7 to voluntarily make the repair request. In the air conditioner 7 that is operable even when the refrigerant leaks, the leakage amount of the refrigerant can be reduced by prompting the user U to voluntarily make the repair request to shorten the period from the generation until the repair of the refrigerant leakage.

(2) The server system 2 notifies the user terminal 6 of the presence or absence of the warranty subscription and the warranty validity period for the repair of the refrigerant leakage, thereby prompting the user U to voluntarily make the repair request.

(3) The server system 2 notifies not only the presence or absence of the warranty subscription but also the prompting of the repair, thereby prompting the user to voluntarily make the repair request.

(4) The server system 2 notifies the user terminal 6 of the repair schedule including the specific candidates of the repair schedule, thereby prompting the user U to voluntarily make the repair request.

(5) The server system 2 notifies the user terminal 6 of the information including the date and time when the refrigerant leakage state is detected, thereby prompting the user U to voluntarily make the repair request.

(6) The server system 2 stores the repair history information indicating the history of the repair of the refrigerant leakage, which can thus be used for the repair.

(7) The user terminal 6 displays the display screen 610 illustrated in FIG. 14, and can thus prompt the user U who views the display screen 610 to make the repair request.

(8) The air conditioner 7 can automatically determine the presence or absence of the refrigerant leakage before entering the full-scale heating and cooling season, according to the detection result during the test operation period of the air conditioner based on the change in the outside air temperature.

[Supplement]

(1) Each of the control devices 30, 40, 60, and 70 can perform the processes by executing each program, and each program may be stored in a (non-transitory) recording medium or may be provided via the communication network 100.

(2) Each of the control devices 30, 40, 60, and 70 may include a plurality of CPUS.

(3) The management terminal 3 and the user terminal 6 are PCs or the like, but may be laptop PCs or desktop PCs. In addition, the management terminal 3 and the user terminal 6 may be a tablet terminal, a smartphone, a smart watch, or the like.

EXPLANATION OF REFERENCES

1: Refrigerant leakage repair system
2: Server system
3: Management terminal
4: Remote management server
6: User terminal (an example of an information terminal)
7: Air conditioner
40: Control device
41: Communication device (an example of an acquisition device or an acquisition means, an example of a transmission device or a transmission means)
49: Storage device (an example of a storage unit or a storage means)
60: Control device
61: Communication device
62: Operating device
64: Display control device (an example of a display controller or a display control means)
69: Storage device
70: Control device
70*a*: Determination unit (an example of a determination circuit or a determination means)
71: Communication device (an example of a communication unit or a communication means)

77: Temperature sensor (an example of a detector or a detection means)

85*a*: Temperature sensor (an example of a detector or a detection means)

85*b*: Temperature sensor (an example of a detector or a detection means)

86*a*: Pressure sensor (an example of a detector or a detection means)

86*b*: Pressure sensor (an example of a detector or a detection means)

618: "Repair request" button (an example of a repair request device or a repair request means)

619: "No repair request" button

What is claimed is:

1. A refrigerant leakage repair system comprising:

a server system; and a plurality of air conditioners, a first air conditioner among the plurality of air conditioners comprising:

an indoor unit including a first temperature sensor configured to detect an indoor air temperature, and an indoor heat exchanger;

an outdoor unit including a compressor, an outdoor heat exchanger, a second temperature sensor configured to detect an intake or discharge temperature of the compressor, a third temperature sensor configured to detect a refrigerant pipe temperature, and a pressure sensor configured to detect an intake or discharge pressure of the compressor, the outdoor unit being connected to the indoor unit via a refrigerant pipe to form a refrigerant circuit that is configured to perform a vapor compression refrigeration cycle by circulating a refrigerant flowing through the refrigerant pipe between the outdoor heat exchanger and the indoor heat exchanger, a first hardware memory configured to store a program;

a processor configured execute the program stored in the first hardware memory to perform a process including:

determining a start timing of a test operation period of the first air conditioner before entering a full-scale heating operation based on a detection signal output from at least one of the first temperature sensor, the second temperature sensor, or the third temperature sensor when the detection signal indicates a lowest temperature of a day lower than a first threshold value, and a start timing of a test operation period of the first air conditioner before entering a full-scale cooling operation based on the detection signal output from at least one of the first temperature sensor, the second temperature sensor, or the third temperature sensor when the detection signal indicates a highest temperature of a day higher than a second threshold value, detecting a state of a refrigerant during the test operation period of the first air conditioner performing the vapor compression refrigeration cycle, based on a detection signal output from at least one of the first temperature sensor, the second temperature sensor, the third temperature sensor, or the pressure sensor and outputting a detection result, and determining a presence or absence of a refrigerant leakage according to the detection result of the detector detecting during the test operation period of the first air conditioner before entering the full-scale heating or cooling operation, and a communication device configured to transmit a leakage notification indicating the presence of the refrigerant leakage to the server system in a case where the determining the presence or absence of the refrigerant leakage determines the presence of the refrigerant leakage, and the server system comprising:

a second hardware memory configured to store warranty subscription information indicating whether or not each air conditioner of the plurality of air conditioners is subscribed to a repair warranty against a refrigerant leakage; and control circuitry configured to perform a process including:

acquiring the leakage notification from the first air conditioner in the case where the presence of the refrigerator leakage is detected during the test operation period of the first air conditioner; and transmitting notification information including the warranty subscription information corresponding to the first air conditioner to an information terminal used by a user of the first air conditioner.

2. The refrigerant leakage repair system as claimed in claim 1, wherein the warranty subscription information includes information indicating a presence or absence of the warranty subscription and a warranty validity period for a repair of the refrigerant leakage.

3. The refrigerant leakage repair system as claimed in claim 1, wherein the notification information includes repair prompt information prompting the repair based on the warranty subscription information.

4. The refrigerant leakage repair system as claimed in claim 3, wherein the repair prompt information includes information indicating candidates of a repair schedule for the refrigerant leakage by a repair service provider.

5. The refrigerant leakage repair system as claimed in claim 3, wherein the repair prompt information includes information indicating a date and time when the leakage notification is acquired.

6. The refrigerant leakage repair system as claimed in claim 1, wherein the second hardware memory stores repair history information indicating a history of the repair of the refrigerant leakage in association with the warranty subscription information.

7. The refrigerant leakage repair system as claimed in claim 1, further comprising:

the information terminal, wherein:

the information terminal includes a display controller configured to display a display screen including the warranty subscription information, and the display screen includes a repair request device configured to make a repair request to a repair service provider.

8. The refrigerant leakage repair system as claimed in claim 1, wherein:

the notification information further includes repair prompt information prompting a repair based on the warranty subscription information, and information that causes display of a repair request button for making a repair request, and the notification information causes the information terminal to display a display screen including the warranty subscription information, the repair prompt information, and the repair request button in response to the notification information.

9. The refrigerant leakage repair system as claimed in claim 1, wherein:

the outdoor unit further includes an outdoor expansion valve connected to the refrigerant pipe, the third temperature sensor is connected to the refrigerant pipe between the outdoor expansion valve and the outdoor heat exchanger, and when a detection signal output from at least one of the first temperature sensor, the second temperature sensor, or the third temperature sensor indicates that a lowest temperature of a day is lower than the first threshold value or that a highest temperature of a day is higher than the second threshold value, the processor automatically drives the compressor by an inverter control and controls the outdoor expansion valve to operate the refrigerant circuit in the test operation period before entering the full-scale heating operation or the full-scale cooling operation.

10. A non-transitory computer-readable recording medium having stored therein one or more programs which, when executed by one or more computers of a refrigerant leakage repair system including a server system and a plurality of air conditioners, causes the one or more computers to perform a process, wherein a first air conditioner among the plurality of air conditioners includes:

an indoor unit including a first temperature sensor configured to detect an indoor air temperature, and an indoor heat exchanger, and an outdoor unit including a compressor, an outdoor heat exchanger, a second temperature sensor configured to detect an intake or discharge temperature of the compressor, a third temperature sensor configured to detect a refrigerant pipe temperature, and a pressure sensor configured to detect an intake or discharge pressure of the compressor, the outdoor unit being connected to the indoor unit via a refrigerant pipe to form a refrigerant circuit that is configured to perform a vapor compression refrigeration cycle by circulating a refrigerant flowing through the refrigerant pipe between the outdoor heat exchanger and the indoor heat exchanger, the process including:

determining a start timing of a test operation period of the first air conditioner before entering a full-scale heating operation based on a detection signal output from at least one of the first temperature sensor, the second temperature sensor, or the third temperature sensor when the detection signal indicates a lowest temperature of a day lower than a first threshold value, and a start timing of a test operation period of the first air conditioner before entering a full-scale cooling operation based on the detection signal output from at least one of the first temperature sensor, the second temperature sensor, or the third temperature sensor when the detection signal indicates a highest temperature of a day higher than a second threshold value;

detecting a state of a refrigerant during the test operation period of the first air conditioner performing the vapor compression refrigeration cycle, based on a detection signal output from at least one of the first temperature sensor, the second temperature sensor, the third temperature sensor, or the pressure sensor and outputting a detection result;

determining a presence or absence of a refrigerant leakage according to the detection result of the detecting during the test operation period of the first air conditioner before entering the full-scale heating or cooling operation;

transmitting a leakage notification indicating the presence of the refrigerant leakage to the server system in a case where the determining the presence or absence of the refrigerant leakage determines the presence of the refrigerant leakage;

acquiring the leakage notification from the first air conditioner in the case where the presence of the refrigerator leakage is detected during the test operation period of the first air conditioner;

referring to a hardware memory that stores warranty subscription information indicating whether or not each air conditioner of the plurality of air conditioners is subscribed to a repair warranty against the refrigerant leakage; and transmitting notification information including the warranty subscription information corresponding to the first air conditioner to an information terminal used by a user of the first air conditioner.

11. The non-transitory computer-readable recording medium as claimed in claim 10, wherein:

the notification information further includes repair prompt information prompting a repair based on the warranty subscription information, and information that causes display of a repair request button for making a repair request, and the notification information causes the information terminal to display a display screen including the warranty subscription information, the repair prompt information, and the repair request button in response to the notification information.

12. The non-transitory computer-readable recording medium as claimed in claim 10, wherein:

the outdoor unit further includes an outdoor expansion valve connected to the refrigerant pipe, the third temperature sensor is connected to the refrigerant pipe between the outdoor expansion valve and the outdoor heat exchanger, and the process further including:

when a detection signal output from at least one of the first temperature sensor, the second temperature sensor, or the third temperature sensor indicates that a lowest temperature of a day is lower than the first threshold value or that a highest temperature of a day is higher than the second threshold value, automatically driving the compressor by an inverter control and controlling the outdoor expansion valve to operate the refrigerant circuit in the test operation period before entering the full-scale heating operation or the full-scale cooling operation.

13. A computer-implemented method for a refrigerant leakage repair system comprising a server system and a plurality of air conditioners, a first air conditioner among the plurality of air conditioners including:

an indoor unit including a first temperature sensor configured to detect an indoor air temperature, and an indoor heat exchanger, and an outdoor unit including a compressor, an outdoor heat exchanger, a second temperature sensor configured to detect an intake or discharge temperature of the compressor, a third temperature sensor configured to detect a refrigerant pipe temperature, and a pressure sensor configured to detect an intake or discharge pressure of the compressor, the outdoor unit being connected to the indoor unit via a refrigerant pipe to form a refrigerant circuit that is configured to perform a vapor compression refrigeration cycle by circulating a refrigerant flowing through the refrigerant pipe between the outdoor heat exchanger and the indoor heat exchanger, the computer-implemented method comprising:

determining a start timing of a test operation period of the first air conditioner before entering a full-scale heating operation based on a detection signal output from at least one of the first temperature sensor, the second temperature sensor, or the third temperature sensor when the detection signal indicates a lowest temperature of a day lower than a first threshold value, and a start timing of a test operation period of the first air conditioner before entering a full-scale cooling operation based on the detection signal output from at least one of the first temperature sensor, the second temperature sensor, or the third temperature sensor when the detection signal indicates a highest temperature of a day higher than a second threshold value;

detecting a state of a refrigerant during the test operation period of the first air conditioner performing the vapor compression refrigeration cycle, based on a detection signal output from at least one of the first temperature sensor, the second temperature sensor, the third temperature sensor, or the pressure sensor and outputting a detection result;

determining a presence or absence of a refrigerant leakage according to the detection result of the detecting during the test operation period of the first air conditioner before entering the full-scale heating or cooling operation;

transmitting a leakage notification indicating the presence of the refrigerant leakage to the server system in a case where the determining the presence or absence of the refrigerant leakage determines the presence of the refrigerant leakage;

acquiring the leakage notification from the first air conditioner in the case where the presence of the refrigerator leakage is detected during the test operation period of the first air conditioner;

referring to a hardware memory that stores warranty subscription information indicating whether or not each air conditioner of the plurality of air conditioners is subscribed to a repair warranty against the refrigerant leakage; and transmitting notification information including the warranty subscription information corresponding to the first air conditioner to an information terminal used by a user of the first air conditioner.

14. The computer-implemented method as claimed in claim 13, wherein:

the notification information further includes repair prompt information prompting a repair based on the warranty subscription information, and information that causes display of a repair request button for making a repair request, and the notification information causes the information terminal to display a display screen including the warranty subscription information, the repair prompt information, and the repair request button in response to the notification information.

15. The computer-implemented method as claimed in claim 13, wherein:

the outdoor unit further includes an outdoor expansion valve connected to the refrigerant pipe, the third temperature sensor is connected to the refrigerant pipe between the outdoor expansion valve and the outdoor heat exchanger, and the computer-implemented method further comprising:

when a detection signal output from at least one of the first temperature sensor, the second temperature sensor, or the third temperature sensor indicates that a lowest temperature of a day is lower than the first threshold value or that a highest temperature of a day is higher than the second threshold value, automatically driving the compressor by an inverter control and controlling the outdoor expansion valve to operate the refrigerant circuit in the test operation period before entering the full-scale heating operation or the full-scale cooling operation.

* * * * *